(12) United States Patent
Inoue et al.

(10) Patent No.: US 6,346,728 B1
(45) Date of Patent: Feb. 12, 2002

(54) PLURAL TRANSISTOR DEVICE WITH MULTI-FINGER STRUCTURE

(75) Inventors: Toshiaki Inoue; Toshirou Watanabe, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/249,579

(22) Filed: Feb. 12, 1999

(30) Foreign Application Priority Data

Feb. 16, 1998 (JP) ............................................. 10-032838
Jan. 20, 1999 (JP) ............................................. 11-011758

(51) Int. Cl.$^7$ ......................... H01L 29/76; H01L 29/94; H01L 31/062; H01L 31/113; H01L 31/119
(52) U.S. Cl. ...................................... 257/341; 257/536
(58) Field of Search ................................ 257/341, 536, 257/208, 365, 287, 350, 401; 438/190, 193, 195, 209, 210, 381, 382

(56) References Cited

U.S. PATENT DOCUMENTS

| 4,223,337 A | | 9/1980 | Kojima et al. ............... 257/786 |
| 5,365,112 A | * | 11/1994 | Ohshima ..................... 257/784 |
| 5,982,000 A | * | 11/1999 | Leighton et al. ............. 257/341 |

FOREIGN PATENT DOCUMENTS

| EP | 0 862 224 | 9/1998 |
| JP | 63-127575 | 5/1988 |
| JP | 7-111271 | 4/1995 |
| JP | 8-250671 | 9/1996 |

* cited by examiner

*Primary Examiner*—Phat X. Cao
(74) *Attorney, Agent, or Firm*—Young & Thompson

(57) ABSTRACT

A semiconductor device has a plurality of transistor units each of which is constituted by a unit prepared by arranging a plurality of unit cells each made up of a drain, gate, and source adjacent to each other on the major surface of a semiconductor substrate, a gate extraction electrode which extends in a direction perpendicular to the longitudinal direction of the gate and is commonly connected to the gates of the unit cells, a drain extraction electrode which is positioned at a side where the drain extraction electrode faces the gate extraction electrode via the unit, extends in a direction perpendicular to the longitudinal direction of the drain, and is commonly connected to the drains of the unit cells, a gate pad connected to the gate extraction electrode, and a drain pad connected to the drain extraction electrodes. The gate pads of adjacent transistor units are connected to each other by a gate extraction electrode connection wiring line having a resistor of 0.6 to 10 Ω. The drain pads are connected to each other by a drain extraction electrode connection wiring line. A method of manufacturing this semiconductor device is also disclosed.

11 Claims, 16 Drawing Sheets

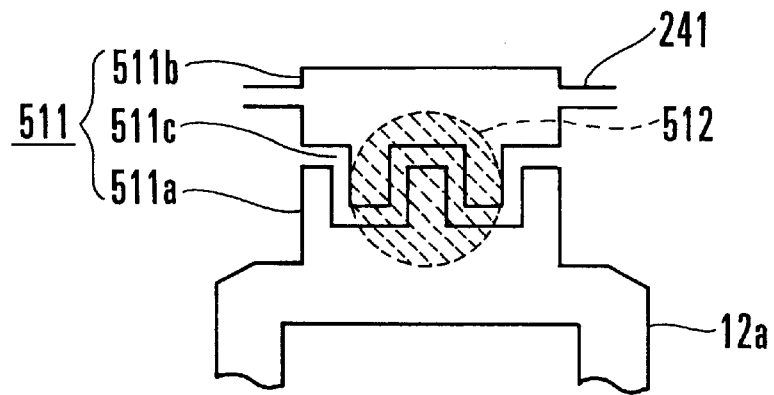
F I G. 10
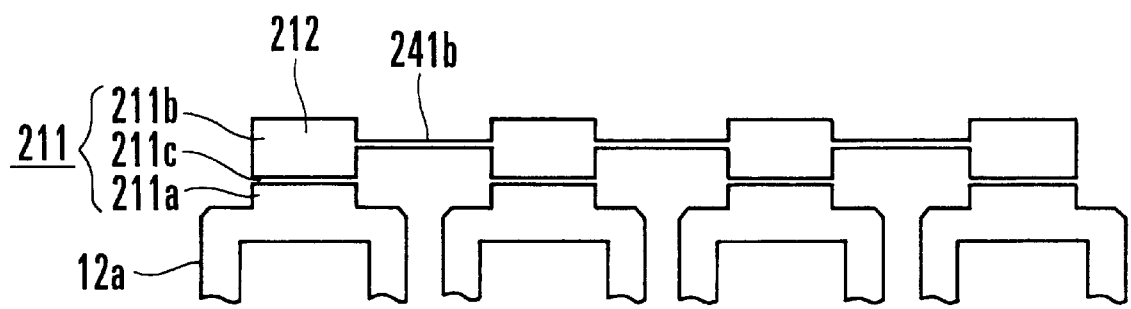
F I G. 11

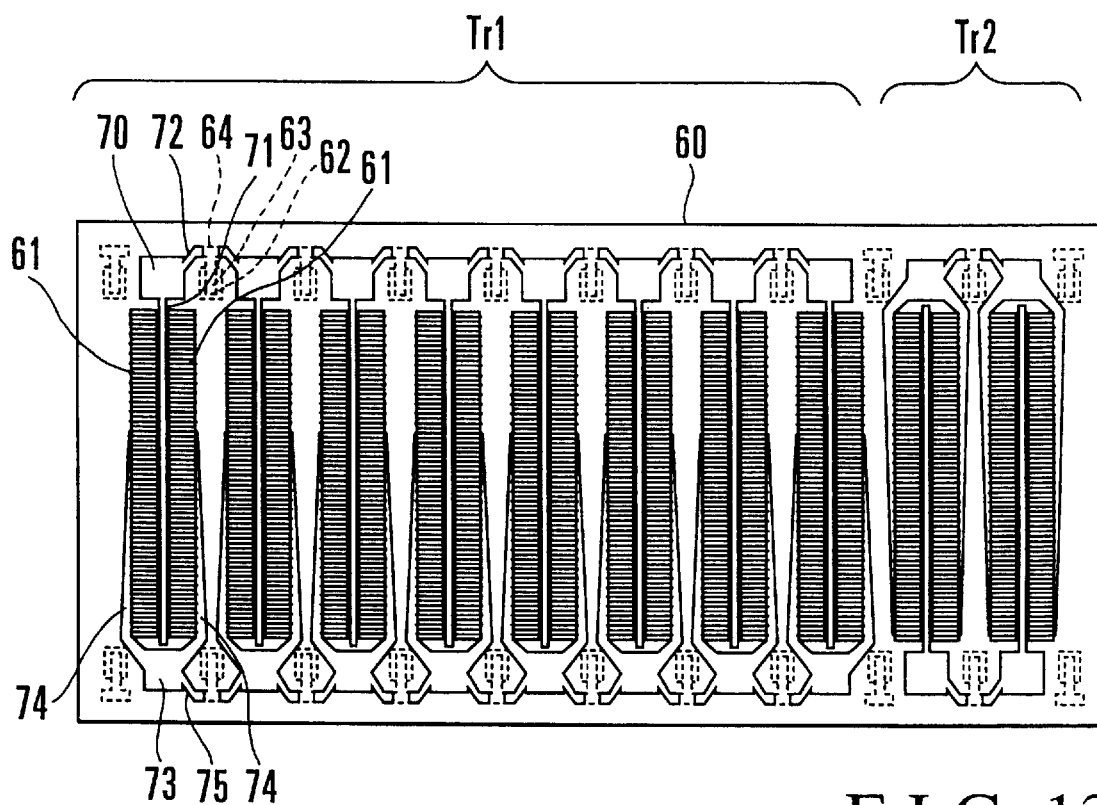
F I G. 13
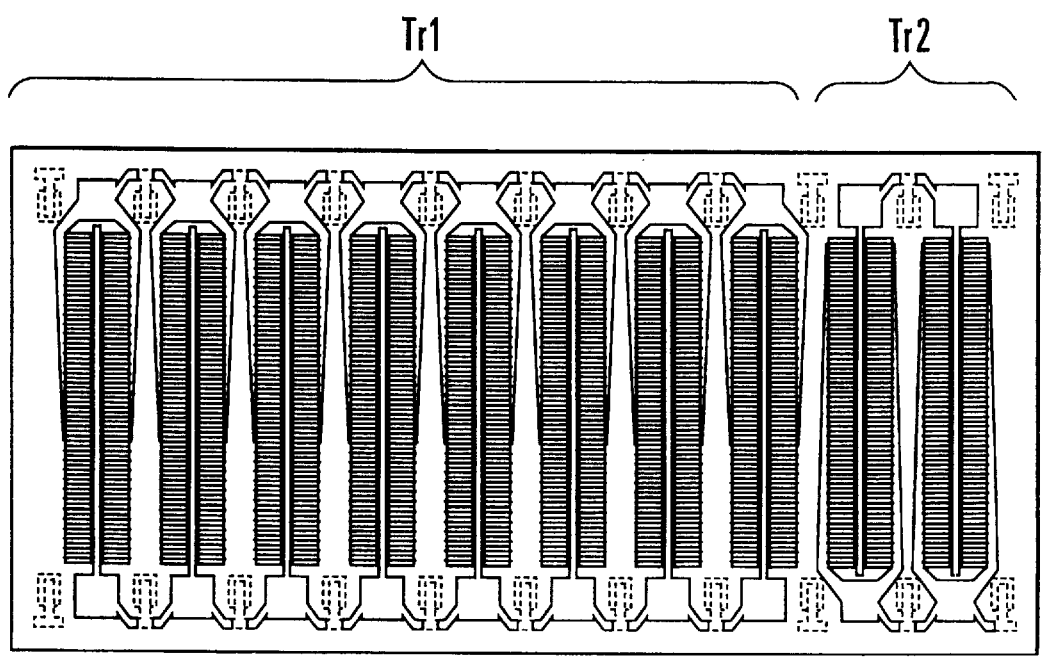
F I G. 14

PLURAL TRANSISTOR DEVICE WITH MULTI-FINGER STRUCTURE

BACKGROUND OF THE INVENTION

The present invention relates to a semiconductor device and a method of manufacturing the same and, more particularly, to a power transistor especially used to amplify ultra high frequencies, that is, a semiconductor device having a plurality of transistor units with a so-called multi-finger structure each of which is constituted by an interdigital electrode, and a unit prepared by arranging a plurality of unit cells each made up of a drain, gate, and source to be adjacent to each other, and a method of manufacturing the same.

Compact, lightweight devices with high efficiency are demanded for semiconductor devices for amplifying high-frequency signals of several hundred MHz or more, e.g., high-frequency power transistors used on the transmission stage of a portable telephone. Particularly, high-frequency power transistors used in a portable telephone using a battery as a power source must be reduced in power amplification circuit current and increased in amplification efficiency.

To meet these demands, there is proposed a power transistor having a multi-finger structure in which a plurality of unit cells each made up of a drain, gate, and source are arranged adjacent to each other, and the drain and gate are alternately connected to comb finger electrodes, thereby forming a field effect transistor (FET) (e.g., Japanese Utility Model Laid-Open No. 51-80063).

FIG. 19 shows the arrangement of an FET having a multi-finger structure with such comb finger electrodes.

Unit cells each made up of a drain, gate, and source are arranged adjacent to each other on the major surface of a semiconductor substrate. The gate and drain of each unit cell are respectively connected to comb-finger-shaped gate and drain finger electrodes 8 and 12.

The source of each unit cell is connected to a $p^+$-implanted layer (not shown in FIG. 19) via a source contact 1d and an electrode 2 immediately above the source.

Each gate finger electrode 8 is connected to a gate extraction electrode 12b, and each drain finger electrode 12 is connected to a drain extraction electrode 12a. The gate and drain extraction electrodes 12b and 12a are respectively connected to gate and drain pads 22 and 21 for connecting bonding wires.

An FET constituted by a plurality of unit cells arranged adjacent to each other, the comb finger gate electrode (the gate finger electrodes 8 and gate extraction electrode 12b), and the comb finger drain electrode (the drain finger electrodes 12 and drain extraction electrode 12a) is called a transistor unit 30.

To obtain a large output from a power transistor, the finger length and the number of finger electrodes are increased in a power transistor having this multi-finger structure, thereby increasing the gate width of the whole element.

However, a long gate finger increases the gate resistance and degrades high-frequency characteristics. If the number of finger electrodes is increased, the chip becomes elongated, and high-frequency characteristics are degraded by a phase shift between finger electrodes.

To solve these problems, a semiconductor device having the conventional multi-finger structure achieves a high output by arranging a plurality of transistor units and increasing the gate width. At the same time, the area efficiency is increased by laying out the gate and drain pads of respective transistor units close to each other.

There is further provided a semiconductor device having a so-called fishbone structure in which a pair of transistor units share a gate extraction electrode to increase the degree of integration.

FIG. 20 shows an example of the arrangement of a power transistor having such a fishbone structure.

A pair of transistor units are constituted by a gate extraction electrode 12b which extends between a pair of two units each prepared by arranging a plurality of unit cells each made up of a drain, gate, and source adjacent to each other, and which is commonly connected to gate finger electrodes 8 of respective unit cells, and two drain extraction electrodes 12a each of which extends to a position where the drain extraction electrode 12a faces the gate extraction electrode 12b and a corresponding unit, and which is commonly connected to drain finger electrodes 12 of the unit.

This structure is called a fishbone structure from the shape of the gate extraction electrode 12b commonly connected to the gate finger electrodes 8.

Note that the fishbone structure also includes a structure having one drain extraction electrode and two gate extraction electrodes, in addition to the above structure having one gate extraction electrode and two drain extraction electrodes. In other words, a structure having a drain extraction electrode which extends between a pair of units and is commonly connected to drain finger electrodes of respective unit cells, and two gate extraction electrodes each of which extends to a position where the gate extraction electrode faces the drain extraction electrode and a corresponding unit, and is commonly connected to gate finger electrodes 8 of the unit is also called a fishbone structure.

One end of the gate extraction electrode 12b is connected to a gate pad 22 for connecting a boding wire. The two drain extraction electrodes 12a are commonly connected to one drain pad 21 at an end opposite to the gate pad 22.

This structure in which two transistor units share the gate extraction electrode 12b and the two drain extraction electrodes 12a are commonly connected to one drain pad 21 is called a transistor unit pair or fishbone cell.

The power transistor in this example is constituted by arranging parallel a plurality (four in FIG. 20) of transistor unit pairs which share a gate extraction electrode.

The power transistor may be constituted by arranging parallel a plurality of transistor unit pairs (fishbone cells) each having one drain extraction electrode and two gate extraction electrodes.

To prevent oscillation and stabilize operation in a conventional semiconductor device having a plurality of transistor unit pairs, adjacent gate pads 22 are connected by gate extraction electrode connection wiring lines 23 made of a conductor such as Al, and adjacent drain pads 21 are connected by drain extraction electrode connection wiring lines 24, as shown in FIG. 20.

However, oscillation cannot always be prevented even if a plurality of transistor unit pairs (or transistor units) are connected by conductors. In particular, the semiconductor device tends to oscillate with a large number of transistor unit pairs (or transistor units) and a large total gate width.

For example, FIG. 21 shows a graph of static characteristics of the drain current in the semiconductor device formed on an Si substrate with the arrangement shown in FIG. 20 when the gate width is 40 mm, and gate or drain pads are connected to each other. In FIG. 21, the abscissa and ordinate respectively represent the drain voltage and drain current using the gate voltage as a parameter. Although the drain current increases together with the gate voltage, the semiconductor device oscillates to distort the drain voltage vs. drain current graph.

The semiconductor device made up of a plurality of transistor unit pairs (or transistor units) oscillates because operation states are different between respective transistor unit pairs (or transistor units) even within a single chip, and this unbalance increases phase interference between the transistor unit pairs (or transistor units). Oscillation arising from this phase interference is called loop oscillation.

In the conventional semiconductor device, even if gate or drain pads are connected to each other, and one of the pads fails to be connected by a bonding wire, this error of the semiconductor device cannot be detected by DC screening. To detect a bonding error critically influencing a high-frequency operation of the semiconductor device, time-consuming, high-cost, radio frequency (RF) screening must be conducted.

SUMMARY OF THE INVENTION

The present invention has been made in consideration of these problems, and has as its object to prevent oscillation of a semiconductor device constituted by a plurality of transistor units or transistor unit pairs.

It is another object of the present invention to provide a semiconductor device in which gate pads or drain pads are connected to each other, and a bonding error can be detected by DC screening without any RF screening, and a method of manufacturing the same.

To achieve the above objects, according to the present invention, there is provided a semiconductor device having a plurality of transistor units or transistor unit pairs, wherein gate pads of adjacent transistor units are connected to each other by a gate extraction electrode connection wiring line having a resistor of 0.6 to 10 $\Omega$, and drain pads are connected to each other by a drain extraction electrode connection wiring line.

The transistor unit is constituted by a unit prepared by arranging a plurality of unit cells each made up of a drain, gate, and source adjacent to each other on the major surface of a semiconductor substrate, a gate extraction electrode which extends in a direction perpendicular to the longitudinal direction of the gate and is commonly connected to the gates of the unit cells, a drain extraction electrode which is positioned at a side where the drain extraction electrode faces the gate extraction electrode via the unit, extends in a direction perpendicular to the longitudinal direction of the drain, and is commonly connected to the drains of the unit cells, a gate pad connected to the gate extraction electrode, and a drain pad connected to the drain extraction electrodes.

As described above, the transistor unit pair means a pair of parallel transistor units which share the gate or drain extraction electrode.

In other words, the transistor unit pair is constituted by a pair of units each prepared by arranging a plurality of unit cells each made up of a drain, gate, and source adjacent to each other on the major surface of a semiconductor substrate, a gate extraction electrode which extends between the pair of units in a direction perpendicular to the longitudinal direction of the gate and is commonly connected to the gates of the unit cells of these units, two drain extraction electrodes which are positioned at sides where the drain extraction electrodes respectively face the gate extraction electrode via the pair of units, extend in a direction perpendicular to the longitudinal direction of the drain, and are commonly connected to the drains of the unit cells of corresponding units, a gate pad connected to one end of the gate extraction electrode, and a drain pad commonly connected to one end of each of the drain extraction electrodes that opposes the gate pad.

In the present invention, the transistor unit pair may comprise two gate extraction electrodes and a common drain extraction electrode.

The gate extraction electrode connection wiring line connects adjacent gate pads to electrically connect the gate extraction electrodes of adjacent transistor units or transistor unit pairs.

Similarly, the drain extraction electrode connection wiring line connects adjacent drain pads to electrically connect the drain extraction electrodes of adjacent transistor units or transistor unit pairs.

In the semiconductor device according to the present invention, loop oscillation caused by operational unbalance between transistor units or transistor unit pairs attenuates while passing through the resistor of the gate extraction electrode connection wiring line. In the present invention, gate pads are connected to each other by the gate extraction electrode connection wiring line having a resistor, thereby cutting off the loop oscillation and preventing oscillation of the semiconductor device such as a power transistor having a plurality of transistor units or transistor unit pairs.

In the present invention, gate pads are connected to each other via a resistor because the resistor does not depend on any frequency.

When the gate width is 40 mm or less, the resistance value of the gate extraction electrode connection wiring line is properly set to 0.6 to 10 $\Omega$ depending on the total gate width of the semiconductor device, i.e., unit cells. The resistance value is set to 0.6 $\Omega$ or more because loop oscillation cannot be attenuated and cut off at a resistance value less than 0.6 $\Omega$, and the same problem arises as in the case in which gate pads are connected by a conductor (almost 0 $\Omega$ in resistance). The resistance value is set to 10 $\Omega$ or less because, especially in high-frequency operation, a resistance higher than 10 $\Omega$ exhibits the same effects as in the case in which no gate pads are connected to each other, and makes operation unstable to allow the semiconductor device to oscillate, as in the case in which no gate pads are connected to each other.

In general, a proper resistance value of the gate extraction electrode connection wiring line has a relationship with the gain of the semiconductor device, more particularly, a total gate width Wg. The resistance value is empirically found to decrease as the total gate width Wg increases.

The present invention does not limit a combination of the total gate width Wg and the resistance value as far as the resistance value of the gate extraction electrode connection wiring line is 0.6 to 10 $\Omega$ when the gate width is 40 mm or less. When the semiconductor substrate is made of Si and the total gate width (Wg) of unit cells is 40 mm or less, the resistance of the gate extraction electrode connection wiring line may be set to 1 to 8 $\Omega$.

Transconductance (gm) can be attained by increasing the total gate width of the semiconductor device, whereas oscillation can be prevented.

In the present invention, the material and structure of the gate extraction electrode connection wiring line are not limited so long as the wire has the above-mentioned resistance value. The gate extraction electrode connection wiring line is characterized by being formed from a multilayered interconnection made of tungsten silicide (WSi) and polysilicon (poly-Si).

Of the materials used for semiconductor devices, WSi and undoped poly-Si are materials having relatively high resistivities. A WSi/poly-Si resistance can be used for part or all of the gate extraction electrode connection wiring line to realize a desired resistance value.

WSi can be used for the gate electrode to facilitate the semiconductor device manufacturing process.

In the present invention, drain pads are also connected to each other. In this case, the drain extraction electrode connection wiring line for connecting drain pads may be formed from a conductor almost 0 Ω in resistance or may have a resistor. That is, the drain extraction electrode connection wiring line is formed from a conductor or a resistor less than 10 Ω.

The present invention can prevent oscillation with the resistor of the gate extraction electrode connection wiring line when the gain of the semiconductor device is large, e.g., when the total gate width Wg of the semiconductor is large or when the substrate is made of GaAs.

The present invention does not limit a combination of the total gate width Wg and the resistance value as long as the resistance value of the gate extraction electrode connection wiring line is set to 0.6 to 2.0 Ω, and the resistance value of the drain extraction electrode connection wiring line is set to 0.6 to 2.0 Ω when the gate width is 78 mm or less.

Each of the gate and drain pads is formed from a first region connected to a gate or drain extraction electrode, a second region connected to the gate or drain extraction electrode connection wiring line, and a slit for insulating the first and second regions. The first and second regions may be connected to each other by a bonding wire.

Since the slits are formed in the gate and drain pads, when no bonding wire is connected to the gate or drain pad, the gate or drain of the transistor unit (or transistor unit pair) having this pad is electrically insulated from other transistor units (or other transistor unit pairs).

A bonding wire connection error can therefore be detected by measuring the drain current by DC screening without any RF screening using high frequencies.

In the present invention, the slits must be formed to electrically connect the first and second regions by a bonding wire, but the shape of the slits is not particularly limited. The first and second regions may be formed into a comb tooth shape via a slit. With this structure, the slit is formed into a zigzag shape to further ensure electrical connection between the first and second regions by a bonding wire.

The drain extraction electrode connection wiring line may comprise a fuse. In this structure, when each drain pad is connected by a lead serving as an external terminal of the semiconductor device and a bonding wire, almost no current flows through the drain extraction electrode connection wiring line in normal operation.

When, however, the bonding wire is disconnected between the drain pad and lead, the drain current flows into an adjacent drain pad via the drain extraction electrode connection wiring line to disconnect the fuse. As a result, the transistor unit (or transistor unit pair) connected to the disconnected bonding wire is electrically insulated from other transistor units (or other transistor unit pairs). An error of the bonding wire connected to the drain pad can be detected by measuring the drain current of the semiconductor device in DC screening.

Either one or both of the drain and gate pads may be connected to diodes.

Two or one end of the gate extraction electrode may be connected to a resistor of 1 to 16 Ω. This can prevent oscillation and attenuate the gain.

Further, according to the present invention, there is provided a method of manufacturing a semiconductor device, comprising the steps of forming in advance an underlying wafer in which a plurality of units are formed on the major surface of a semiconductor substrate, and appropriately changing a wiring layout of an uppermost layer of the underlying wafer to form a gate extraction electrode, a drain extraction electrode, a gate pad, and a drain pad into desired shapes, thereby manufacturing transistor units having a desired arrangement. According to this method, a MOSFET complying with a desired standard can be quickly manufactured in accordance with customer's requirements.

BRIEF DESCRIPTION OF THE DRAWINGS

FIG. 10 is a view showing another example of a slit;

FIG. 11 is a view showing another example of a drain extraction electrode connection wiring line;

FIG. 13 is a plan view showing a 1.8-GHz-band twin MOSFET at an operation voltage of 3.5 V;

FIG. 14 is a plan view showing the state in which the layout in FIG. 13 is mirror-turned upside down;

DESCRIPTION OF THE PREFERRED EMBODIMENT

An embodiment of the present invention will be described below with reference to the accompanying drawings.

Figure 1:
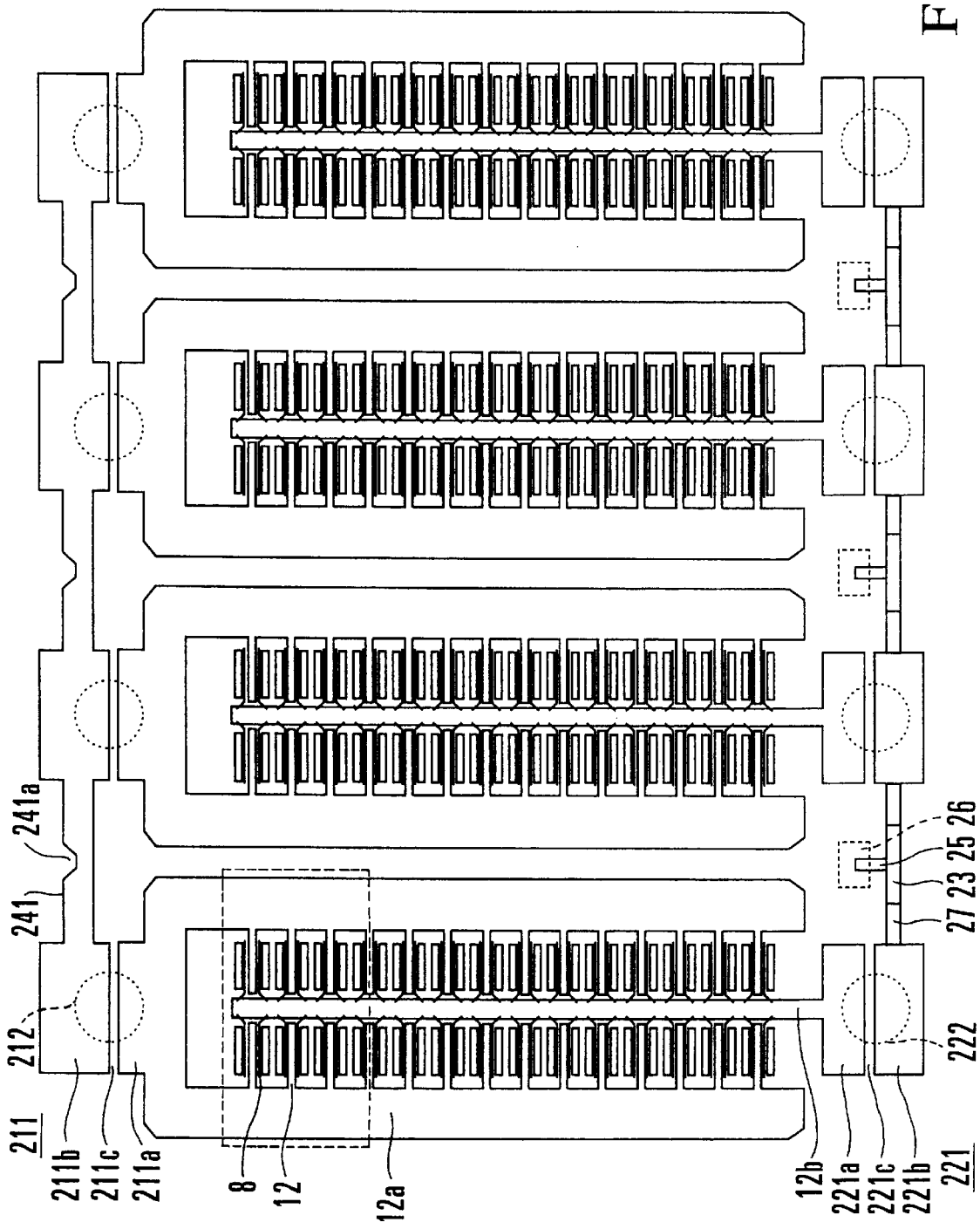
FIG. 1 is a plan view showing the layout of a semiconductor device according to an embodiment of the present invention.

FIG. 1 shows the arrangement of a semiconductor device according to the embodiment of the present invention.

This semiconductor device is a high-frequency power transistor having a plurality of transistor units on an Si substrate.

As shown in FIG. 1, one transistor unit is formed by arranging a plurality of unit cells each made up of a drain, gate, and source. Gate finger electrodes 8 connected to the gates of respective unit cells are commonly connected to a gate extraction electrode 12b. Drain finger electrodes 12 connected to the drains of respective unit cells are commonly connected to a drain extraction electrode 12a.

Two transistor units which are arranged parallel, share the gate extraction electrode 12b, and are connected to a gate pad 221 for connecting a bonding wire at one end of the gate extraction electrode 12b and to one drain pad 211 for commonly connecting two drain extraction electrodes are called a transistor unit pair or fishbone cell.

In the high-frequency power transistor according to this embodiment, slits 221c and 211c are formed in the gate and drain pads 221 and 211, as will be described later.

The detailed structure of the transistor unit will be described with reference to FIGS. 2 and 3.

Figure 2:
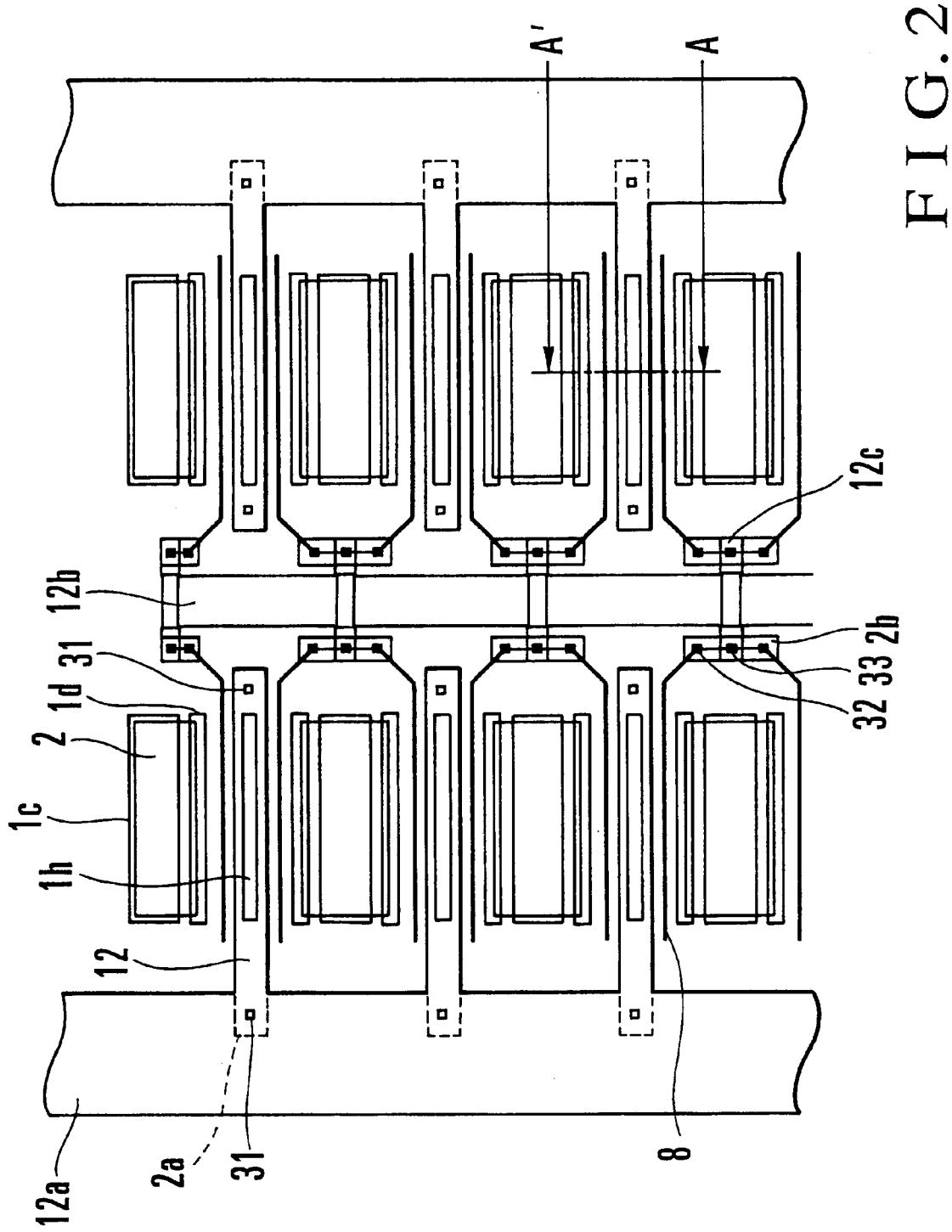
FIG. 2 is a plan view for explaining the detailed structure of a transistor unit pair constituting the semiconductor device according to the embodiment of the present invention.

FIG. 2 shows an enlarged portion surrounded by the broken line in FIG. 1.

As shown in FIG. 2, a drain finger electrode (first aluminum interconnection; to be referred to as 1 Al) 2a connected to a drain contact 1h in a semiconductor substrate is connected to a corresponding drain finger electrode (second aluminum interconnection; to be referred to as 2 Al) 12 via a through hole 31. The drain finger electrodes 12 of respective unit cells are commonly connected to the drain extraction electrode 12a.

The gate finger electrode 8 is connected to a gate interconnection (1 Al) 2b via a through hole 32, and the gate interconnection (1 Al) 2b is connected to a corresponding gate extraction electrode projection 12c via a through hole 33. The gate extraction electrode projections 12c are commonly connected to the gate extraction electrode 12b.

If the gate extraction electrode 12b is formed from the same first aluminum interconnection as the gate interconnection (1 Al) 2b, an interlevel insulating film between the first aluminum interconnection and a semiconductor substrate 1 has a thickness equal to the sum of the thicknesses of a gate oxide film ($SiO_2$) 7, an $SiO_2$ layer 9, and a BPSG layer 10. This interlevel insulating film is very thin, so the stray capacitance of the gate extraction electrode increases to greatly degrade high-frequency characteristics. Therefore, the gate extraction electrode is desirably formed from the second aluminum interconnection. However, if the second aluminum interconnection directly contacts the gate finger electrode 8, the aspect ratio of the contact hole becomes high to easily cause contact errors.

To prevent this, the gate finger electrode 8 is temporarily connected to the gate extraction electrode projection 12c via the gate interconnection (1 Al) 2b, and then to the gate extraction electrode 12b serving as the second aluminum interconnection.

The source contact 1d in the semiconductor substrate is connected to an electrode (1 Al) 2 immediately above the source, and the electrode (1 Al) 2 is connected to a $p^+$-implanted layer 1c in the semiconductor substrate.

In this embodiment, the drain extraction electrode 12a is 25 $\mu$m wide and 500 $\mu$m long. The gate extraction electrode 12b is 20 $\mu$m wide and 450 $\mu$m long. Each of the drain finger electrode (1 Al) 2a and drain finger electrode (2 Al) 12 is 3.2 $\mu$m wide and 50 $\mu$m long. The gate finger electrode 8 is 0.6 $\mu$m wide and 50 $\mu$m long. The source contact 1d is 1.2 $\mu$m wide and 50 $\mu$m long. The $p^+$-implanted layer 1c is 6.8 $\mu$m wide and 48 $\mu$m long.

Figure 3:
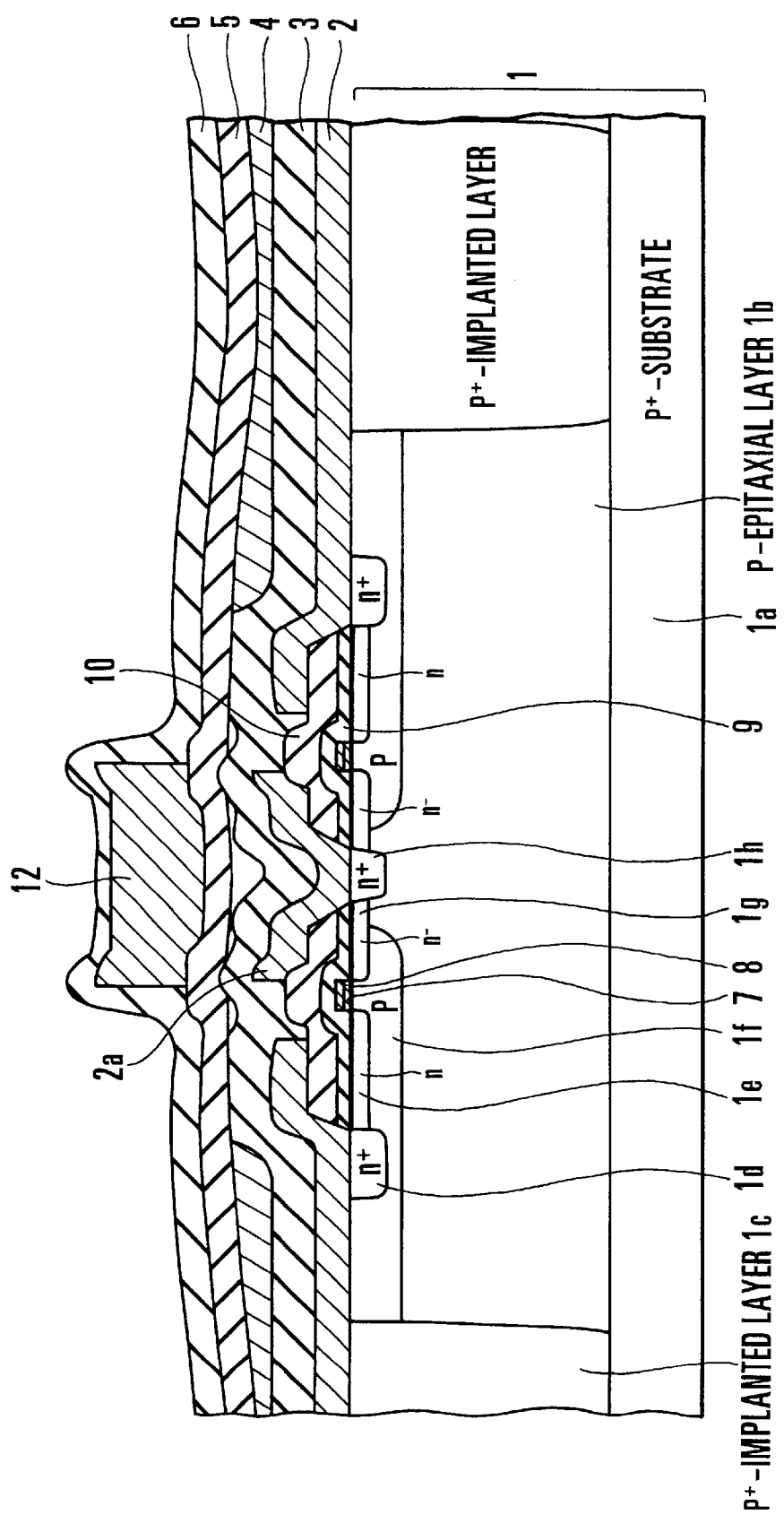
FIG. 3 is a sectional view taken along the line A–A' in FIG. 2 to explain the detailed structure of a transistor unit constituting the semiconductor device according to the embodiment of the present invention.

FIG. 3 shows a section taken along the line A–A' in FIG. 2.

As shown in FIG. 3, a $p^+$-substrate 1a, p-epitaxial layer 1b, $p^+$-implanted layer 1c, source contact ($n^+$) 1d, source diffusion layer (n) 1e, p-well 1f, drain diffusion layer ($n^-$) 1g, and drain contact 1h are formed by lithography or the like on the Si substrate 1 as a semiconductor substrate. Each unit cell constitutes an n-channel MOS transistor.

A 1 Al interconnection (electrode 2, drain finger electrode 2a, and the like), a plasma-TEOS (plasma-TetraEthylOrthoSilicate) layer (to be referred to as a p-TEOS layer) 3, an organic silica+inorganic silica layer 4, a p-TEOS layer 5, a 2 Al interconnection (drain finger electrode 12 and the like), and a passivation nitride film (to be referred to as p-nitride film) 6 are sequentially formed on the Si substrate 1 from the substrate surface.

The 1 Al interconnection is formed by sequentially stacking TiN or Ti (thickness: 80 nm), Al-Si-Cu (thickness: 0.55 $\mu$m), and TiN (thickness: 30 nm) from the Si substrate 1 side.

The gate oxide film 7 is formed on the p-well 1f, and the gate finger electrode 8 is formed on the gate oxide film 7. The gate finger electrode 8 is formed by sequentially stacking poly-Si (thickness: 150 nm) and WSi (thickness: 170 nm) from the major surface side of the Si substrate 1. The gate finger electrode 8 is processed to have a section as thin as about 0.6 $\mu$m. The gate finger electrode 8 is entirely covered with the $SiO_2$ layer 9 serving as a first interlevel insulating film. The $SiO_2$ layer 9 is covered with the BPSG layer 10 serving as a second interlevel insulating film.

When a gate voltage is applied, the gate finger electrode 8 formed in this manner generates an electric field in a channel formed in the p-well 1f in the Si substrate 1 via the gate oxide film 7. This gate voltage controls the conductivity of a channel between the source diffusion layer (n) 1e and drain diffusion layer ($n^-$) 1g.

The drain finger electrode (1 Al) 2a and drain finger electrode (2 Al) 12 extend parallel to the gate finger electrode 8, as shown in FIG. 2. The drain finger electrode (1 Al) 2a is connected to the drain diffusion layer 1g in the Si substrate 1 via the drain contact 2h, and to the drain finger electrode (2 Al) 12 via the contact 31.

The source diffusion layer 1e extends from an end of the gate finger electrode 8 to the source contact 1d in the longitudinal direction of the gate. The source diffusion layer 2e is connected via the source contact 1d to the electrode (1 Al) 2 immediately above the source. The electrode 2 is connected to the $p^+$-implanted layer 1c in which a heavily doped layer is formed until it reaches the $p^+$-substrate 1a.

Table 1 shows the thicknesses of respective layers on the Si substrate 1.

TABLE 1

|  |  | Thickness |
|---|---|---|
| p-Nitride Film 6 |  | 500 nm |
| p-TEOS Layer 5 |  | 600 nm |
| Organic Silica + Inorganic Silica Layer 4 |  | Apply to planarize step and the like |
| p-TEOS Layer 3 |  | 800 nm |
| Electrode 2 | TiN | 30 nm |
| Immediately Above Source | Al-Si-Cu | 0.55 μm |
|  | TiN & Ti | 80 nm |
| Drain Finger Electrode (2 Al) 12 |  | 1.6 μm |
| BPSG Layer 10 |  | 650 nm |
| SiO₂ Layer 9 |  | 180 nm |
| Gate Finger Electrode 8 | WSi | 170 nm |
|  | Poly-Si | 150 nm |
| Gate Oxide Film (SiO₂) 7 |  | 35 nm |

In the high-frequency power transistor according to this embodiment, four transistor unit pairs each having the above-described structure are arranged parallel, as shown in FIG. 1. Adjacent gate pads are connected to each other via gate extraction electrode connection wiring lines 23, and adjacent drain pads are connected to each other via drain extraction electrode connection wiring lines 241.

Each gate extraction electrode connection wiring line 23 comprises a gate protection diode 26 and a resistor 27.

The gate protection diode 26 prevents electrostatic destruction of the gate oxide film and the like.

Figure 4A:
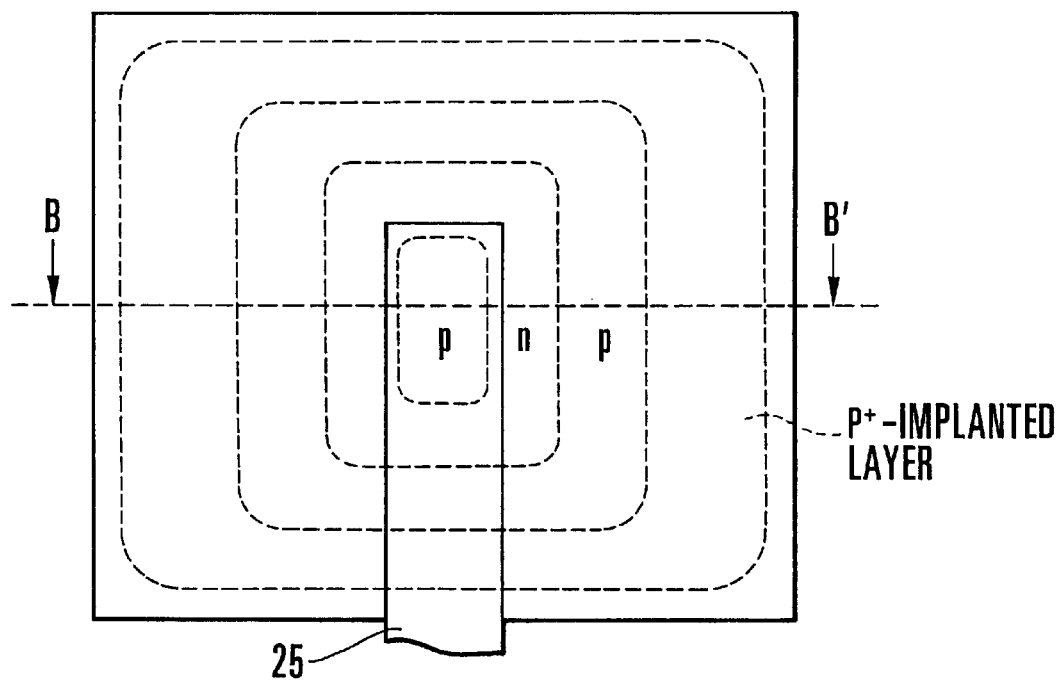
FIGS. 4A and 4B are plan and sectional views, respectively, showing the structure of a gate protection diode.
Figure 4B:
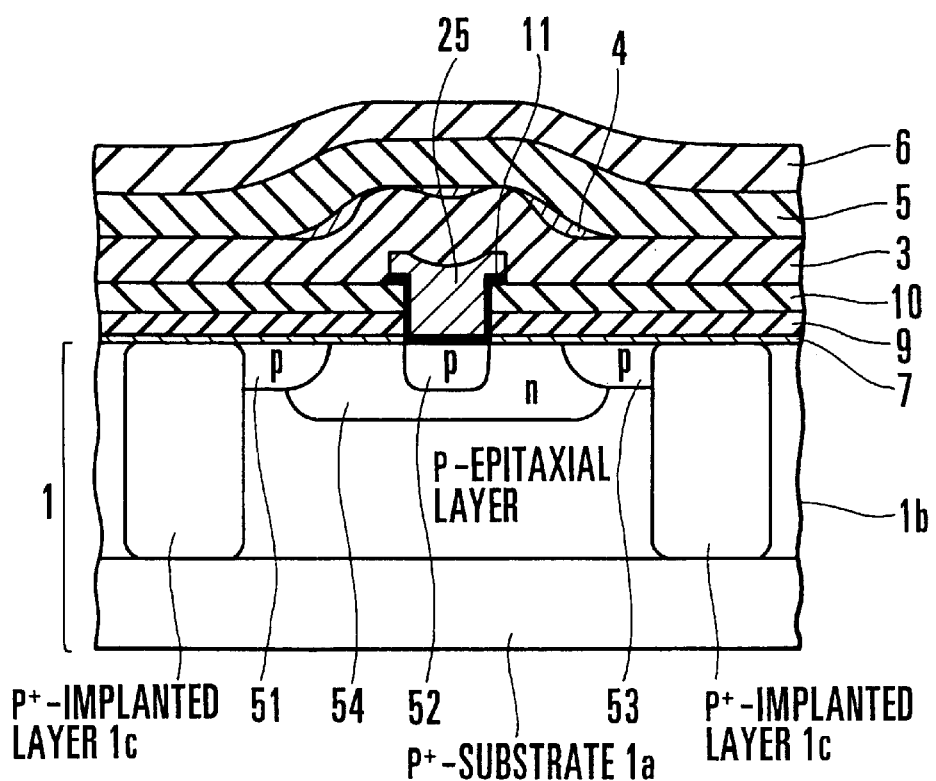

FIG. 4A shows the structure of the gate protection diode 26, and FIG. 4B shows a section taken along the line B–B'.

As shown in a section of the FIG. 4B, the Si substrate 1 is formed from the p⁺-substrate 1a and the overlying p-epitaxial layer 1b. The p-epitaxial layer 1b includes two p-n-p junctions serving as a gate protection diode. The p⁺-implanted layer 1c is formed from the major surface of the Si substrate 1 to the p⁺-substrate 1a. The p⁺-implanted layer 1c is connected to a p-diffusion layer 51.

As shown in FIG. 4A, an interconnection 25 extracted from the gate extraction electrode connection wiring line 23 in FIG. 1 is connected to a p-diffusion layer 52 of the diode formed in the Si substrate 1. A barrier metal 11 (made of TiN and Ti) is formed between the interconnection 25 and Si substrate 1.

The resistor 27 of the gate extraction electrode connection wiring line 23 is formed by sequentially stacking WSi and poly-Si, similar to the gate finger electrode 8.

The resistor 27 gives a resistance of 0.6 to 10 Ω to the gate extraction electrode connection wiring line 23 for connecting the gate pads 221.

FIGS. 5A, 5B, 6A, and 6B show static characteristics when the resistor 27 is formed on the gate extraction electrode connection wiring line 23 of the semiconductor device formed on the Si substrate.

In each graph, the abscissa and ordinate respectively represent the drain voltage and drain current using the gate voltage as a parameter.

Figure 5A:
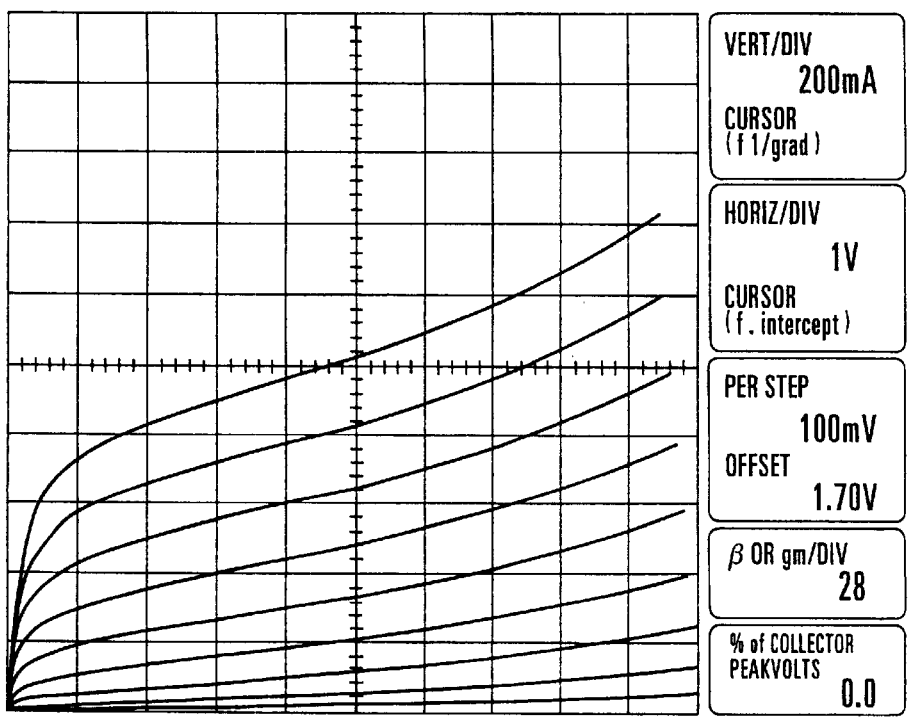
FIGS. 5A and 5B are graphs showing static characteristics of the semiconductor device according to the embodiment of the present invention.
Figure 5B:
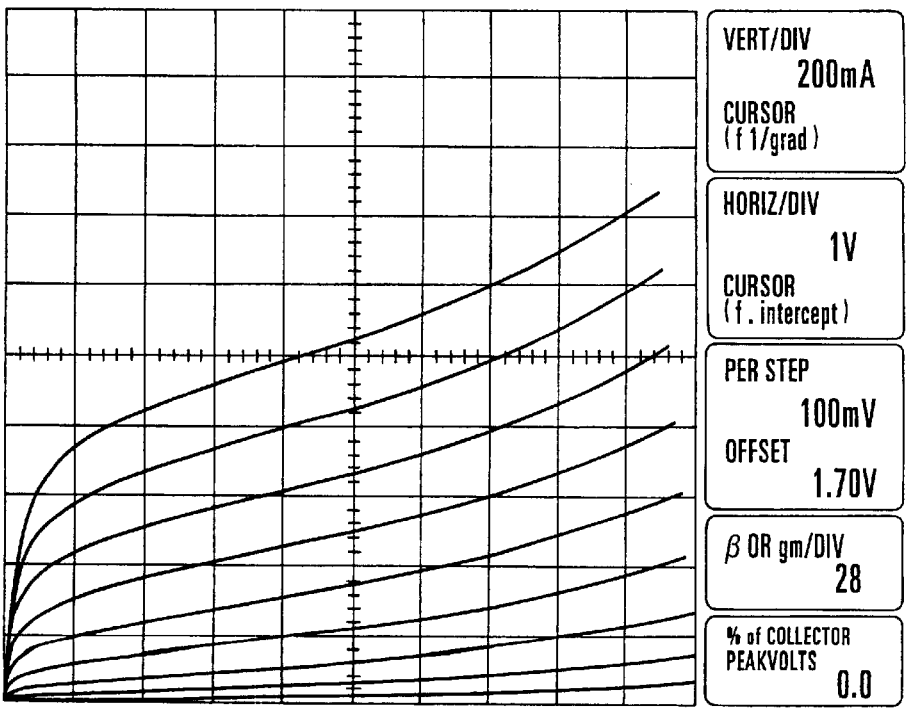
Figure 6A:
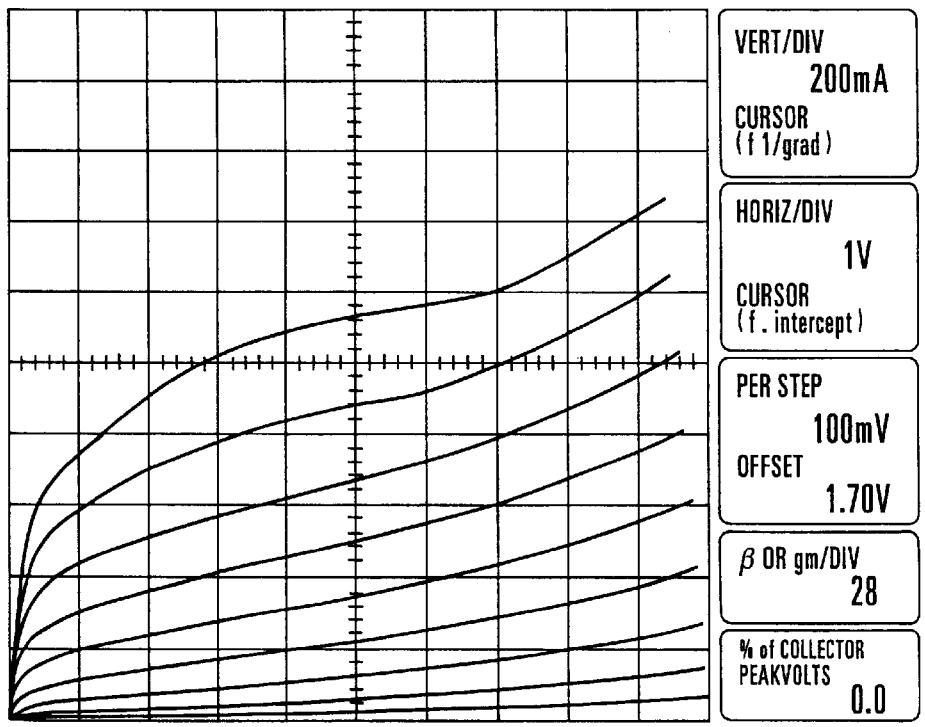
FIGS. 6A and 6B are graphs showing static characteristics of the semiconductor device according to the embodiment of the present invention.
Figure 6B:
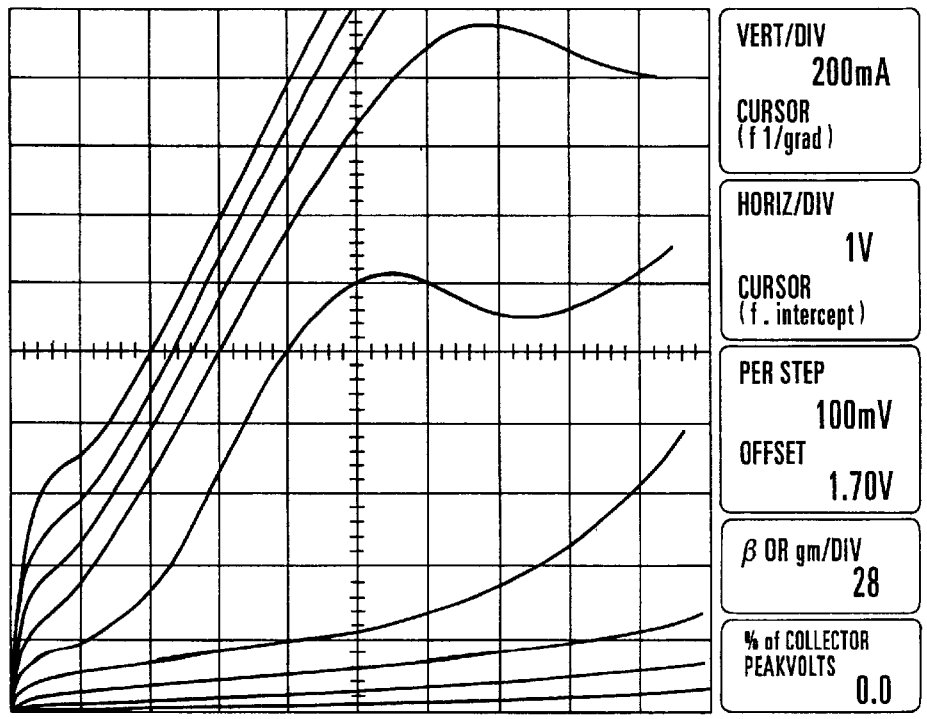

In FIGS. 5A and 5B, the gate extraction electrode connection wiring lines 23 have resistance values of 4 Ω and 8 Ω. In FIGS. 6A and 6B, the gate extraction electrode connection wiring lines 23 have resistance values of 15 Ω and 30 Ω. In FIGS. 5A, 5B, 6A, and 6B, the semiconductor device has the arrangement shown in FIG. 1, a total gate width Wg is 40 mm, and the drain extraction electrode connection wiring line 241 made of aluminum is 0 Ω in resistance.

When the resistance value is 4 Ω (FIG. 5A) or 8 Ω (FIG. 5B), the drain voltage vs. drain current graph is not distorted compared to the case in which the gate extraction electrode connection wiring line is 0 Ω in resistance (see FIG. 14). This means that oscillation can be prevented by connecting adjacent gate pads 221 via a 4- or 8-Ω resistor.

This is because phase influence caused by operational unbalance between transistor unit pairs is reduced by the resistor 27 of the gate extraction electrode connection wiring line 23 to cut off loop oscillation.

To the contrary, FIGS. 6A and 6B show that the drain voltage vs. drain current graph is distorted, and the semiconductor device oscillates when the resistance value is 15 Ω (FIG. 6A) or 30 Ω (FIG. 6B).

This is because when the resistance value is high, the same problem arises as in the case in which no gate pads 221 are connected.

To prevent oscillation, therefore, the resistor of the gate extraction electrode connection wiring line 23 is properly set to 0.6 to 8 Ω when the total gate width Wg is 40 mm. This resistance value range narrows as the total gate width Wg increases. According to experimental results, for example, a proper resistance value range is 0.6 to 3 Ω when the total gate width Wg is 60 mm, and 0.6 to 2 Ω when the total gate width Wg is 80 mm.

Figure 7:
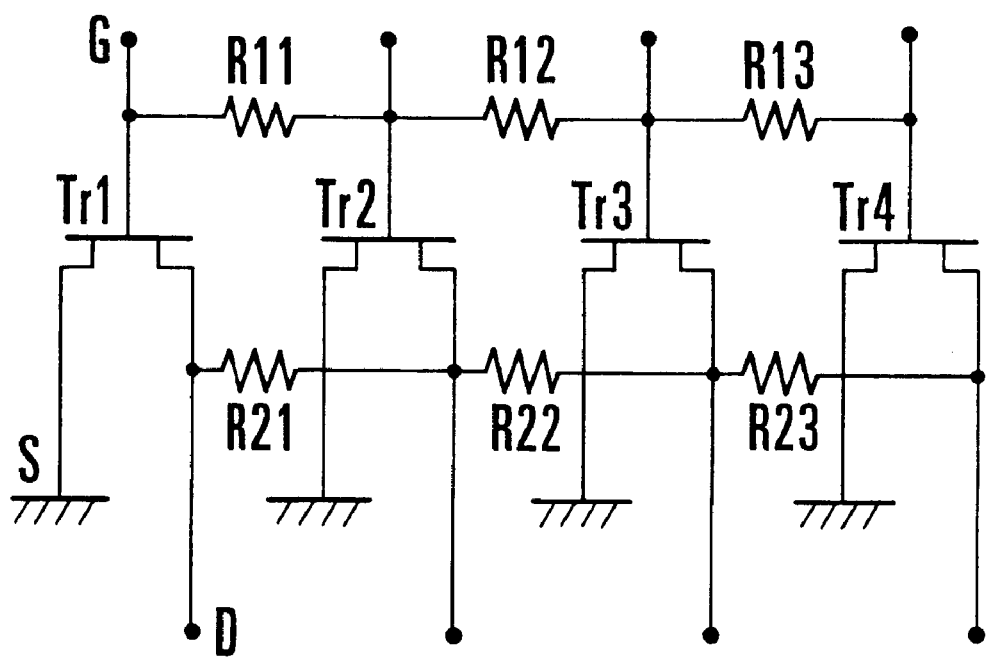
FIG. 7 is a circuit diagram showing the semiconductor device according to the embodiment of the present invention.

FIG. 7 shows the circuit arrangement of the semiconductor device according to the present invention.

In FIG. 7, four transistors Tr1 to Tr4 respectively correspond to transistor unit pairs.

Reference numerals R11 to R13 denote resistors of the gate extraction electrode connection wiring lines 23.

The resistance values (R21 to R23) of the drain extraction electrode connection wiring lines 241 for preventing oscillation properly fall within the range of 0 to 10 Ω, and when the total gate width Wg is 40 mm or more and the semiconductor device has a large gain, more desirably fall within the range of 0.6 to 2.0 Ω

The gate and drain pads 221 and 211 are connected to a lead frame (not shown FIG. 1) via bonding wires.

In this embodiment, the gate pad 221 has the slit 221c. The slit 221c divides the gate pad 221 into a first region 221a connected to the gate extraction electrode 12b and a second region 221b connected to the gate extraction electrode connection wiring line 23.

As shown in FIG. 1, the two regions 221a and 221b forming the gate pad 221 are electrically connected by connecting a bonding wire 222 to the gate pad 221.

Similarly, the drain pad 211 has the slit 211c. The slit 211c divides the drain pad 211 into a first region 211a connected to the drain extraction electrode 12a and a second region 211b connected to the drain extraction electrode connection wiring line 241. The two regions 211a and 211b forming the drain pad 211 are electrically connected by connecting a bonding wire 212, as shown in FIG. 1.

In this embodiment, each of the gate and drain pads 221 and 211 is a square with a 100-μm side, and each of the formed slits 221c and 211c has a width of 2 μm.

The gate and drain pads 221 and 211 having these slits can be formed by patterning the first and second regions (221a and 221b, and 211a and 211b) at an interval of 1 to 5 μm.

Since the slits are formed in the gate and drain pads 221 and 211, when no bonding wire is connected to the gate or drain pad, the gate or drain of the transistor unit (or transistor unit pair) having this pad is electrically insulated from other transistor units (or other transistor unit pairs).

Accordingly, a connection error of the bonding wire to the gate or drain pad 221 or 211 can be detected by measuring the drain current in DC screening. The defective can be easily screened without any time-consuming RF screening.

The drain extraction electrode connection wiring line 241 of the semiconductor device according to this embodiment has a fuse 241a.

The fuse 241a is realized by narrowing the width of part of the drain extraction electrode connection wiring line 241 and decreasing the current capacity.

More specifically, part of an aluminum wire formed as the drain extraction electrode connection wiring line 241 is processed into 1 µm in width so as to disconnect the fuse 241a when a current of 5 µmA or more flows.

Since the fuse 241a is formed in this way, when a bonding wire for connecting the drain pad 211 and the lead frame (not shown in FIG. 1) is disconnected, the drain current flows into an adjacent drain pad via the drain extraction electrode connection wiring line 241 to disconnect the fuse 241a. No drain current flows through the transistor unit pair defective in the bonding wire, and the defective can be detected by measuring the drain current flowing through the semiconductor device without any RF screening.

In FIG. 1, four transistor unit pairs are connected to each other. This is merely an example, and the number of transistor unit pairs can be arbitrarily increased/decreased.

In the above embodiment, the gate pads of the transistor unit pairs are connected by the gate extraction electrode connection wiring line. In the present invention, a plurality of transistor units may be arranged parallel instead of the transistor unit pairs.

Figure 8:
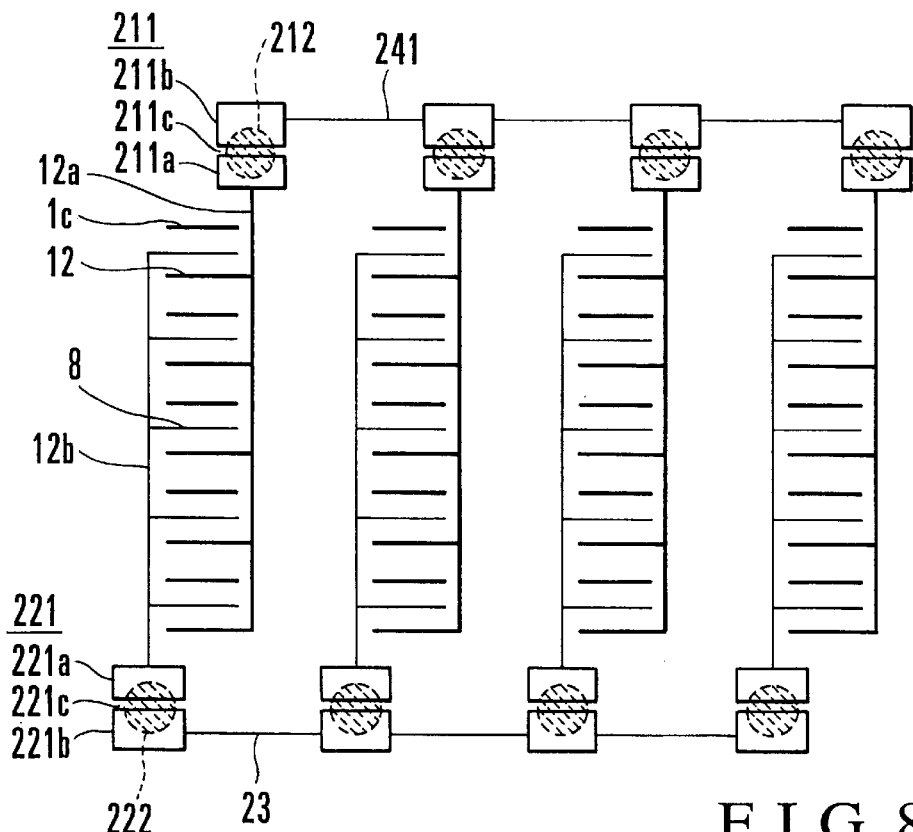
FIG. 8 is a plan view for explaining the layout of a semiconductor device according to another embodiment of the present invention.
Figure 9:
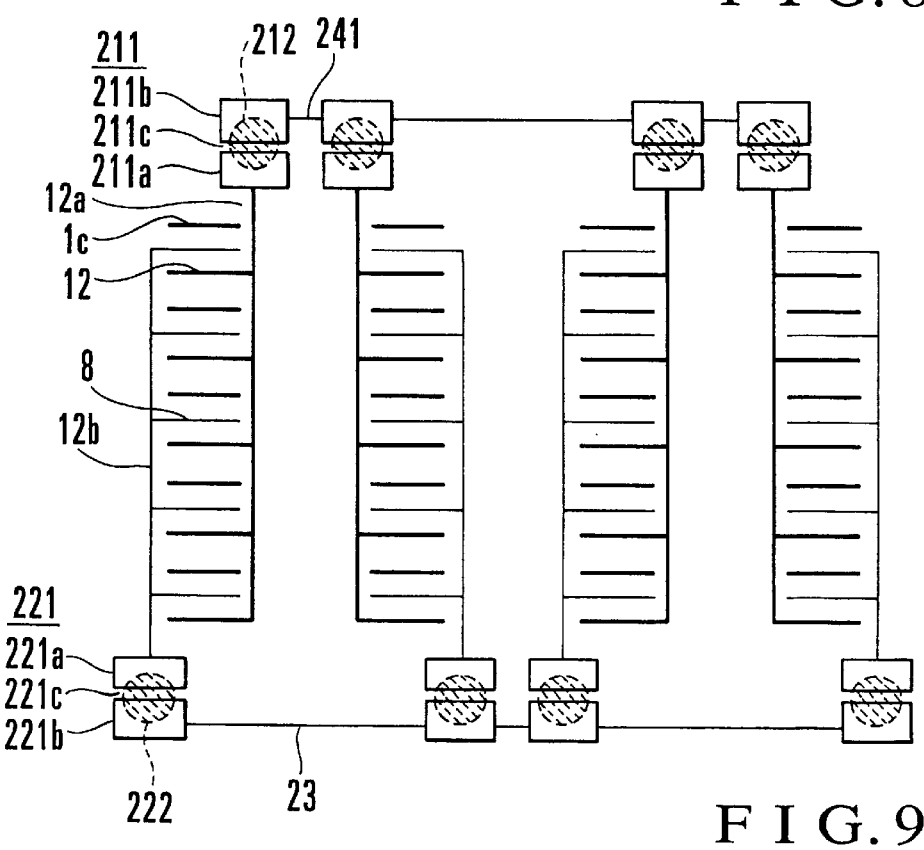
FIG. 9 is a plan view for explaining the layout of a semiconductor device according to still another embodiment of the present invention.

FIGS. 8 and 9 show other examples of the power transistor in which a plurality of transistor units are arranged as other embodiments of the present invention.

In FIG. 8, a semiconductor device is constituted by arranging four transistor units parallel to each other. In a semiconductor device shown in FIG. 9, adjacent transistor units are arranged symmetrical about each other.

In either of the semiconductor devices shown in FIGS. 8 and 9, adjacent gate pads 221 are connected by gate extraction electrode connection wiring lines 23. Drain pads 211 are connected by drain extraction electrode connection wiring lines 241.

Also in these embodiments, each gate extraction electrode connection wiring line 23 has the same structure as shown in FIG. 1 with a resistor of 0.6 to 10 Ω.

Connecting the gate pads 221 via the resistor prevents oscillation of the power transistor constituted by a plurality of transistor units.

Note that the structure of each transistor unit has been described above, and a description thereof will be omitted.

In these embodiments, similar to the embodiment shown in FIG. 1, the gate and drain pads 221 and 211 have slits 221c and 211c.

First and second regions 221a and 221b of the gate pad 221 divided by the slit 221c are connected by a bonding wire 222.

Similarly, first and second regions 211a and 211b of the drain pad 211 divided by the slit 211c are connected by a bonding wire 212.

Since the slits are formed in the gate and drain pads 221 and 211, even if adjacent pads are connected by the gate and drain extraction electrode connection wiring lines 23 and 241, a bonding wire connection error can be detected by DC screening.

In the embodiments shown in FIGS. 1, 8, and 9, the slits 221c and 211c are formed into a straight line, but may be formed into a zigzag shape.

FIG. 10 shows an example in which first and second regions 511a and 511b of a drain pad 511 are formed into a comb tooth shape via a slit 511c. This more reliably connects the first and second regions (511a and 511b) by a bonding wire 512.

This structure is also effective for the gate pad though not shown.

In FIG. 1, the fuse 241a is formed by narrowing the width of part of the drain extraction electrode connection wiring line 241.

Alternatively, in FIG. 11, the drain extraction electrode connection wiring line 241 is formed from an aluminum wire 2 µm in width and 1.6 µm in thickness. The entire drain extraction electrode connection wiring line 241 is formed thin, and disconnected by a current exceeding a predetermined capacity.

In the above-mentioned embodiments, the semiconductor device is formed on an Si substrate. A semiconductor material used for the semiconductor device according to the present invention is not limited to Si, and may be a compound semiconductor such as GaAs.

A method of manufacturing the semiconductor device according to the present invention will be described with reference to FIG. 12.

In recent years, rapidly widespread portable telephones increase demands for high-frequency, high-output amplification transistors. Inevitable downsizing of portable terminal equipment requires downsizing of transistors. To meet this demand, a twin-transistor chip on which two transistors are mounted in one package is developed.

However, various specification systems such as GSM (Global System for Mobile communication) and PDC (Personal Digital Cellular) are established. Even in the same system, required specifications change depending on portable telephone manufacturers owing to their discriminative strategies. For this reason, a twin-transistor chip dedicated to customer's requirements must be designed and developed to be commercially available, which poses the following problems. A chip design for each product requires high development cost. Since the chip is customized and is not versatile, a buffer stock is difficult to keep, resulting in high stock control cost.

In addition, high-frequency, high-output devices suffer common problems. Since each cell RF-short-circuits, the device readily oscillates. In a narrow-gate FET (driver FET), the gate is as high as about 20 dB at 1 GHz, whereas the device isolation is as low as about 20 dB. The device therefore becomes unstable regardless of matching.

The semiconductor device manufacturing method according to the present invention solves these problems at once.

Figure 12:
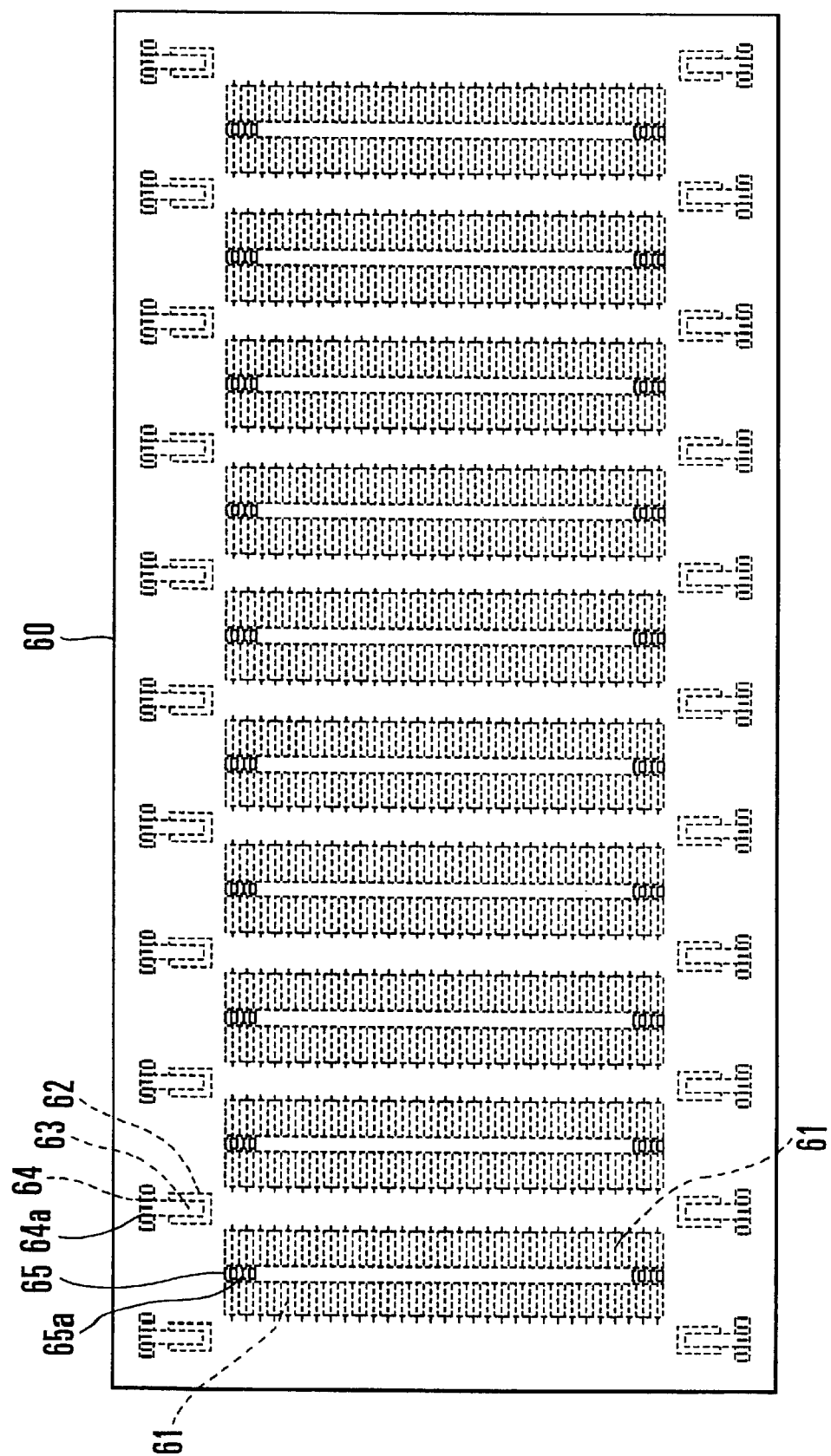
FIG. 12 is a view showing an underlying wafer.

FIG. 12 shows one chip of an underlying wafer in which a portion except for the uppermost interconnection is formed on an Si wafer in advance. As shown in FIG. 12, a plurality of chips in each of which a portion (units 61, resistors 64 and 65, and interconnections 63) except for the interconnection is formed on an Si wafer 60 are formed in advance. Contacts (e.g., contacts 64a and 65a) connected to the resistors 64 and 65 and elements are exposed on the surface of the Si wafer 60. The shape of the uppermost interconnection (to be referred to as a top metal) can be changed in accordance with customer's requirements to obtain a desired cell layout. Each unit 61 is constituted by integrating, e.g., about 78 FETs.

The underlying wafer 60 comprises 10 transistor unit pairs which are directly grounded to the lower surface of the chip at finger portions and have a gate width of 7.8 mm. Six oscillation prevention resistors (resistors 64) with 0.6, 1.0, 1.2, 1.4, 2.0, and 2.2 Ω and an electrostatic destruction prevention diode 62 are formed between the pads of two adjacent transistor unit pairs. The diode 62 and resistors 64 are connected by the interconnection 63. The resistors 64 are actually made from one resistor, this resistor has a plurality of contacts 64a, and thus a desired resistance value (0.6 to 2 Ω) can be obtained by selecting a contact.

Four gain attenuation resistors (resistors 65) with 1, 2, 4, and 8 Ω are formed at a position corresponding to each of the two ends of the gate extraction electrode. Similar to the resistors 64, the resistors 65 are made from one resistor, and this resistor has a plurality of contacts 65a. By selecting the resistors 65 and the contacts 65a, a gain attenuation resistor of 1 to 16 Ω can be realized.

The layout of all elements (FETs, resistors, diodes, and the like) except for the top metal is a layout point symmetrical about the center of each chip, or an equivalent layout. In the semiconductor diffusion process, connection to resistors and diodes can be changed by changing the layout of the top metal, and the positions of gate and drain pads can be freely exchanged. A gate width coping with a required output can be selected so long as the gate width does not exceed the underlying gate width.

FIG. 13 shows an example in which a driver MOSFET 15.6 mm in gate width made up of two transistor unit pairs, and an output MOSFET 40 mm in gate width made up of eight transistor unit pairs are mounted on one chip. This example does not employ any gain attenuation resistor because the frequency is as high as 1.8 GHz. To suppress oscillation on the output stage, gate pads on the output stage are connected to each other by 4-Ω oscillation prevention resistors.

FIG. 14 shows a layout obtained by mirror-turning the layout in FIG. 13 upside down. As shown FIG. 14, the positions of gate and drain pads can be exchanged by only changing the layout of the top metal. This indicates that the layout can flexibly cope with a customer's pin layout requirement.

Figure 15:
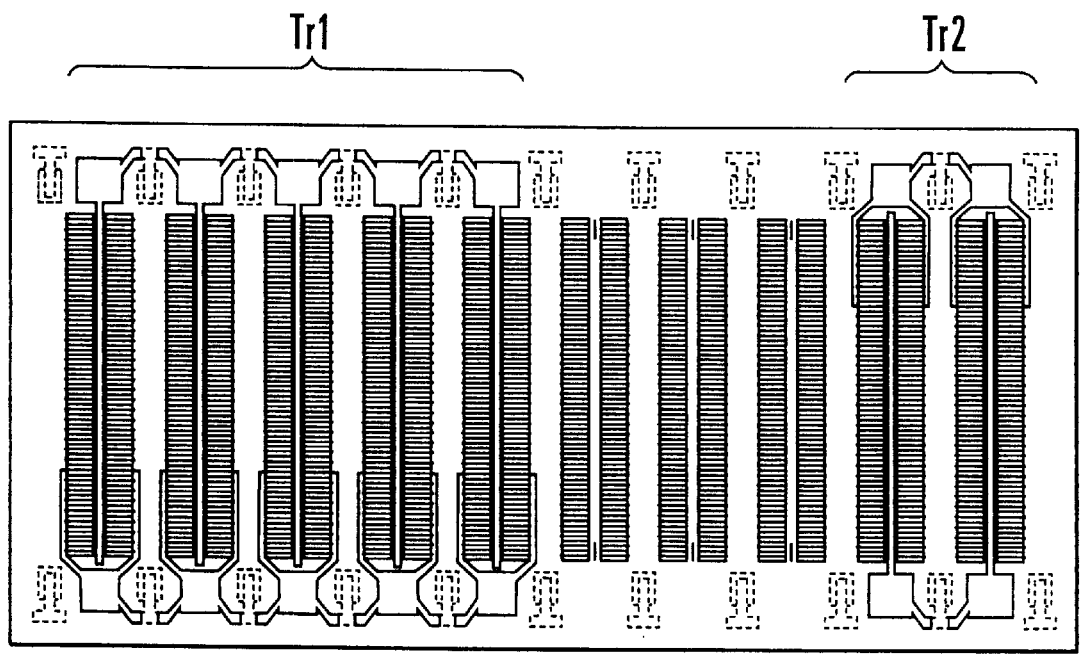
FIG. 15 is a plan view showing a 2.5-GHz-band twin MOSFET at an operation voltage of 3.5 V.

FIG. 15 shows an example in which a driver MOSFET 4 mm in gate width made up of two transistor unit pairs, and an output MOSFET 10 mm in gate width made up of five transistor unit pairs are mounted on one chip. This example does not employ any gain attenuation resistor because the frequency is as high as 2.5 GHz. To suppress oscillation on the output stage, gate pads on the output stage are connected to each other via 4-Ω oscillation prevention resistors.

Figure 16:
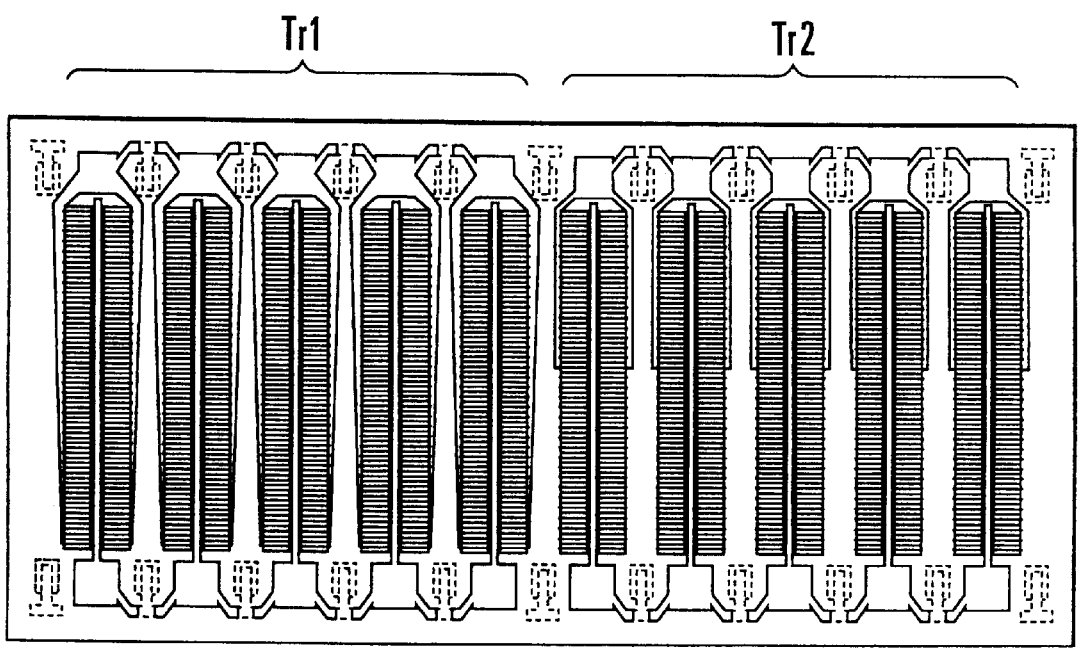
FIG. 16 is a plan view showing a dual-band twice MOSFET at an operation voltage of 3.5 V.

FIG. 16 shows an example in which a 1.8-GHz-band output MOSFET 20 mm in gate width made up of five transistor unit pairs, and a 900-MHz-band output MOSFET 40 mm in gate width made up of five transistor unit pairs are mounted on one chip. In this example, since the two MOSFETs serve as output stages and are often arranged parallel in a portable telephone, gate and drain pads are arranged in the same direction.

Figure 17:
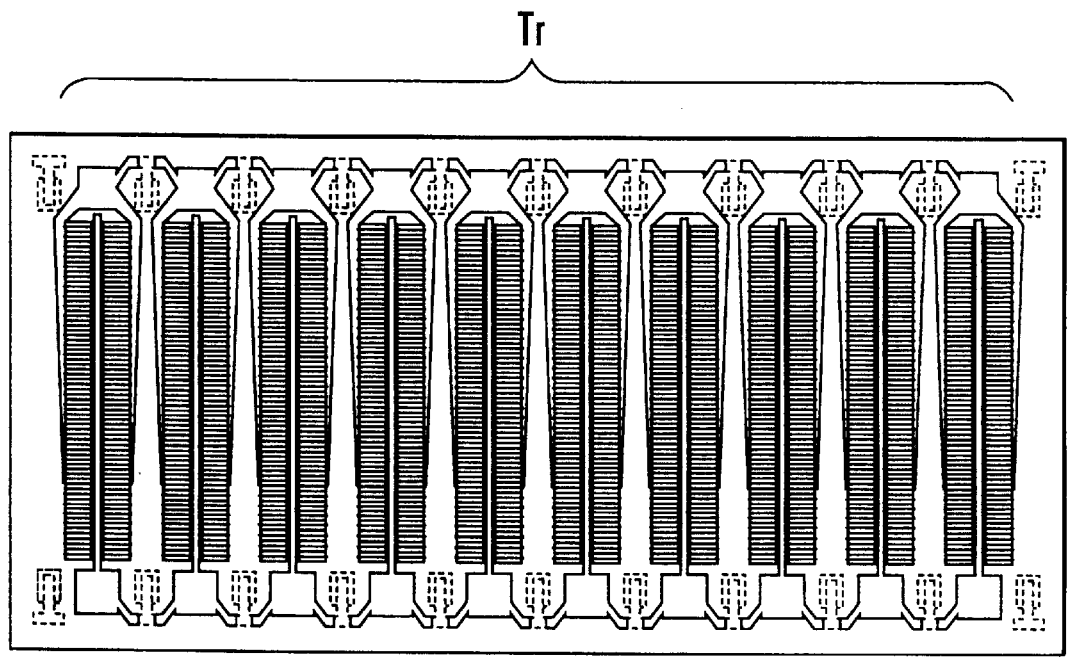
FIG. 17 is a plan view showing a 900-MHz-band single MOSFET at an operation voltage of 3.5 V.

FIG. 17 shows an example in which a 900-MHz-band output single MOSFET 78 mm in gate width made up of 10 transistor unit pairs is mounted on one chip. To suppress oscillation, gate pads are connected to each other via 1.4-Ω oscillation prevention resistors, while drain pads are connected to each other via 1.2-Ω oscillation prevention resistors. Like this example, a single MOSFET up to 78 mm can be constituted.

Figure 18:
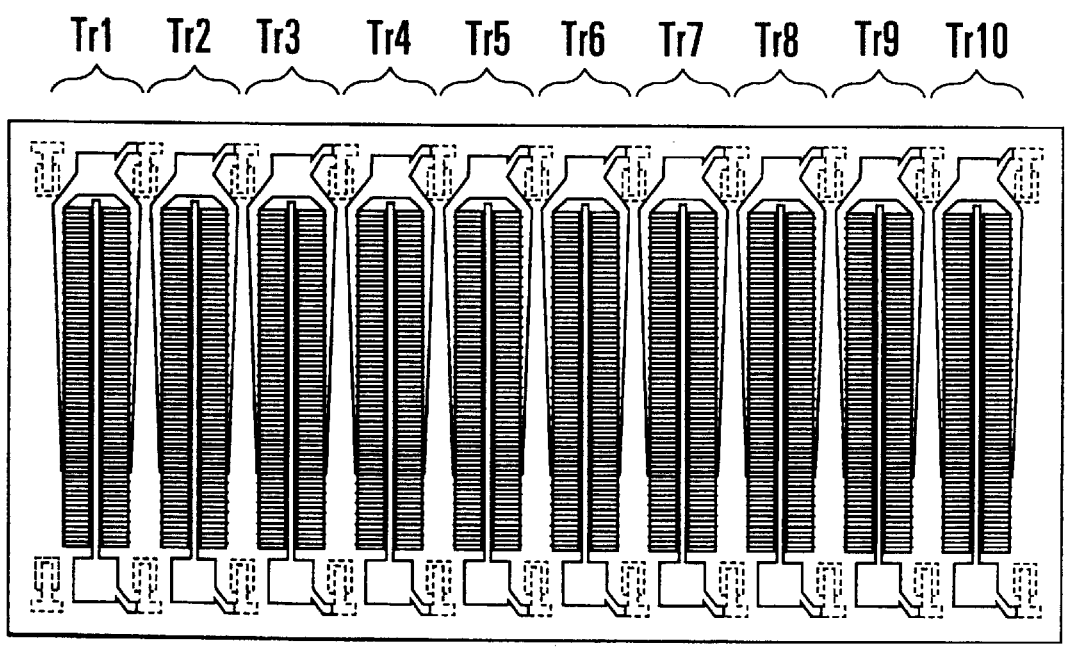
FIG. 18 is a plan view showing an example of constituting 10 MOSFETs.
Figure 19:
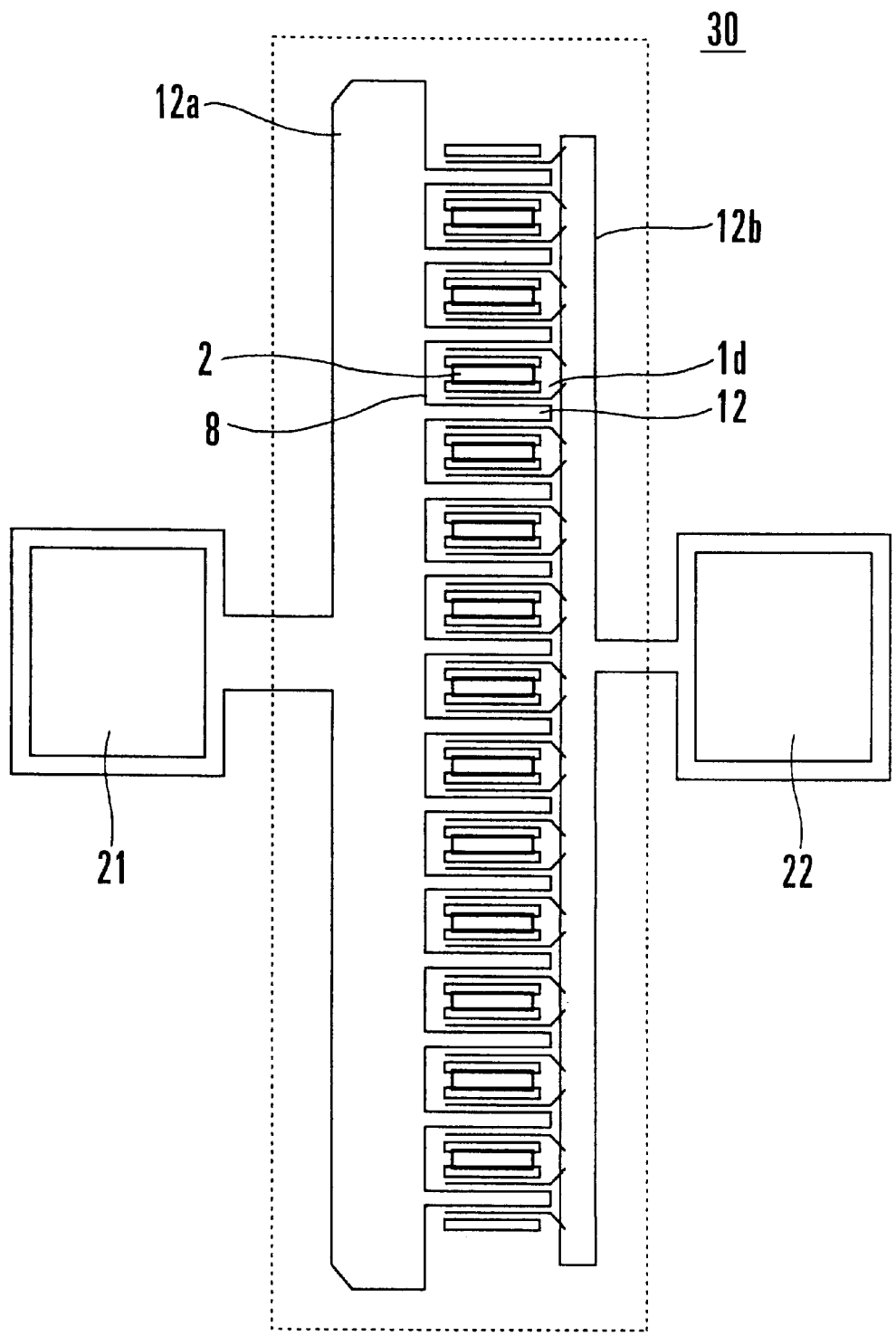
FIG. 19 is a plan view showing the arrangement of an FET having a multi-finger structure.
Figure 20:
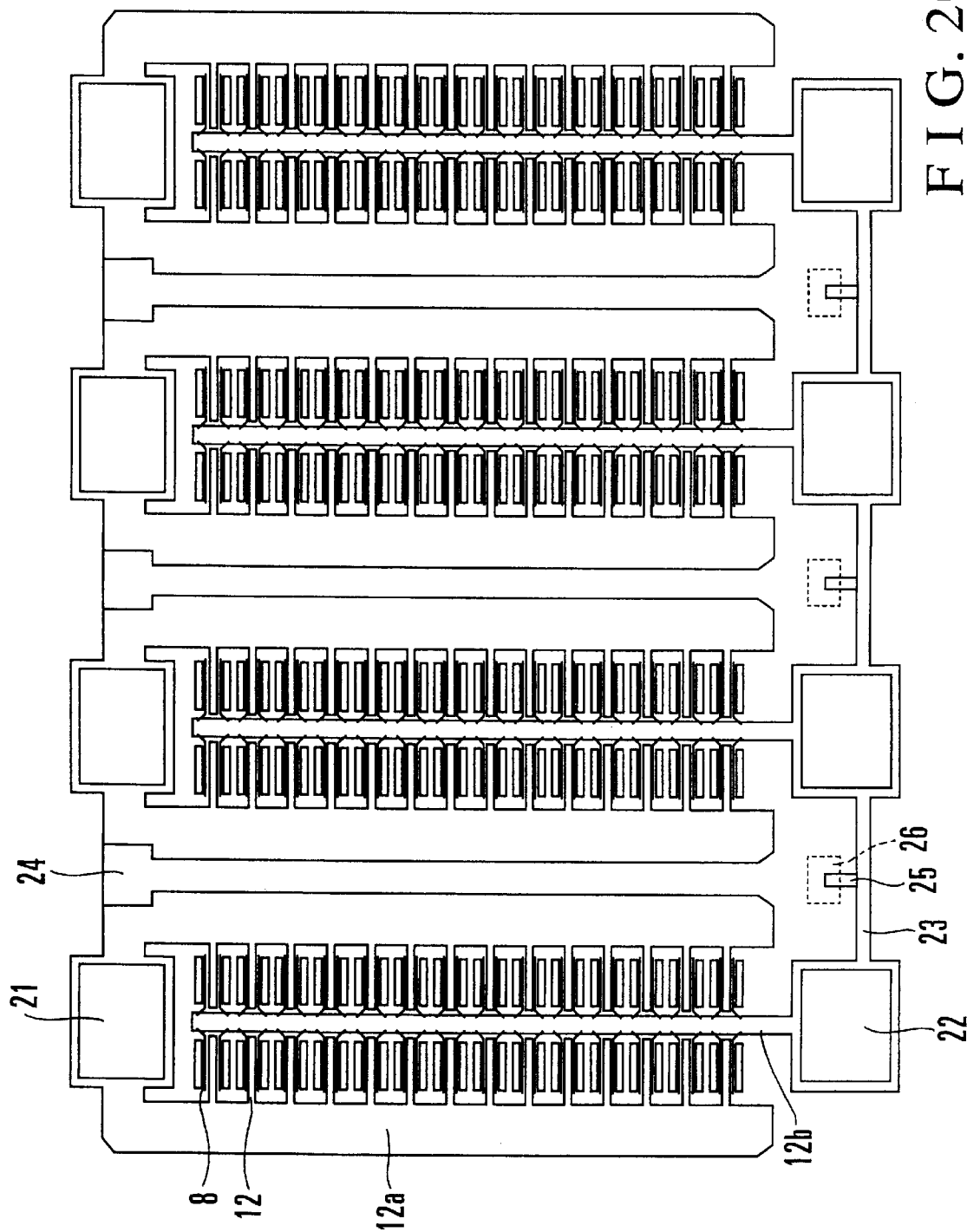
FIG. 20 is a plan view showing an example of the arrangement of a conventional semiconductor device.
Figure 21:
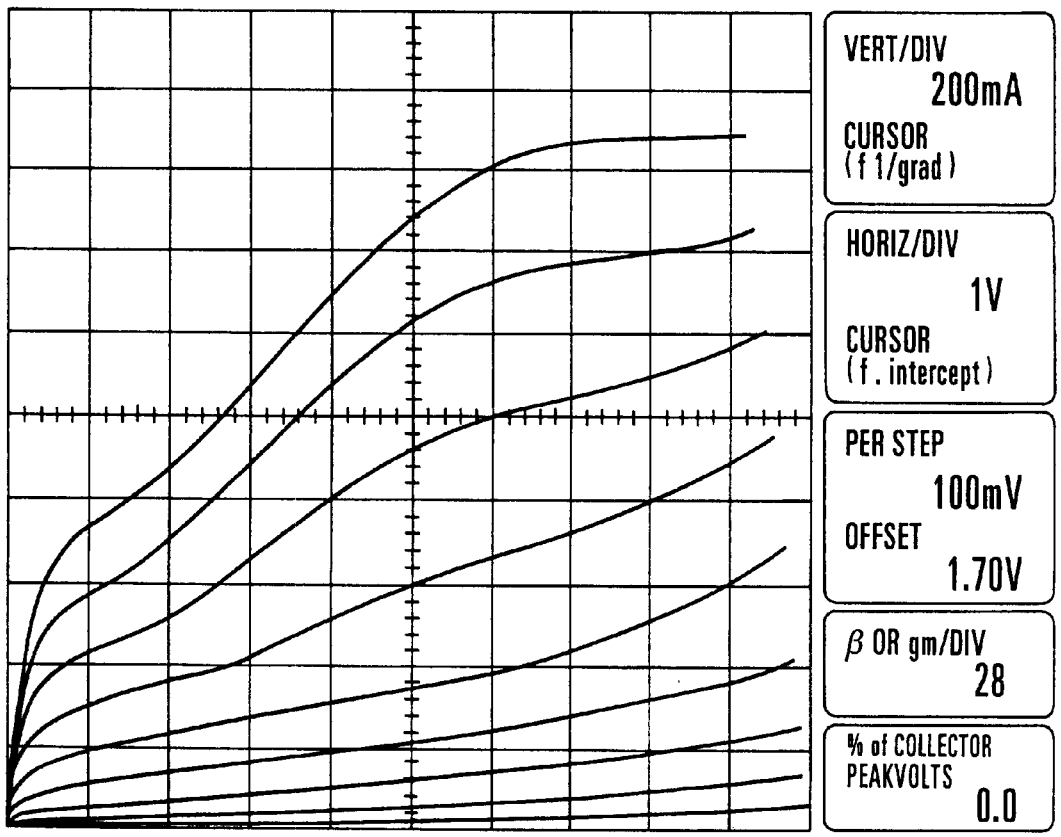
FIG. 21 is a graph showing static characteristics of the conventional semiconductor device.

FIG. 18 shows an example of constituting 10 MOSFETs. In this example, 10 transistor unit pairs function as independent MOSFETs. In this case, all gate and drain pads can be connected to oscillation prevention diodes by forming extra diodes at the four corners of the chip.

As described above, this embodiment adopts a layout in which the source electrodes of FETs are directly grounded to the lower surface of the chip at finger portions, and a portion of all elements (FETs, resistors, diodes, and the like) except for the top metal is point-symmetrical about the chip center, or an equivalent layout. By changing only the top metal, the positions of gate and drain pads can be freely exchanged, and twin MOSFETs having different pin layouts can be easily manufactured.

Oscillation prevention resistors capable of adjusting the resistance value by only changing the wiring of the top metal are arranged between the gate pads and between the drain pads, so that a transistor without any DC oscillation can be manufactured.

In addition, electrostatic destruction prevention diodes are arranged between all the pads of adjacent transistor unit pairs, all the gate pads can be connected to the diodes by only changing the wiring of the top metal, and thus a transistor highly resistant to electrostatic destruction can be manufactured.

Since gain attenuation resistors capable of adjusting the resistance value by only changing the wiring of the top metal are arranged at the two ends of the gate extraction electrode, the gain can be suppressed in an intended use at a low frequency of 1 GHz or less to realize stable amplification.

In an intended use at a high frequency of 1 GHz or more, a multi-cell layout is adopted to minimize the transmission loss on the Si substrate, thereby attaining high additional efficiency.

In this embodiment, a gate extraction electrode 71 is arranged between two units 61, and drain extraction electrodes 74 are arranged outside the units 61. However, the present invention is not limited to this. A layout in which a drain extraction electrode is arranged between two units 61 and two gate extraction electrodes are arranged outside these units can also be easily manufactured and incorporated in the present invention.

According to the present invention, in a semiconductor device having a plurality of transistor units or transistor unit pairs, the gate pads of adjacent transistor units are connected by gate extraction electrode connection wiring lines each having a resistor of 0.6 to 10 Ω. This arrangement can prevent oscillation caused by operational unbalance between the transistor units or transistor unit pairs.

Especially when the resistor of the gate extraction electrode connection wiring line is set to 1 to 8 Ω, oscillation can be prevented in at least a semiconductor device 40 mm or less in total gate width of unit cells formed on an Si substrate.

When the resistors of the gate an d drain extraction electrode connection wiring lines are set to 0.6 to 2.0 Ω, oscillation can be pre vented in at least a semiconductor device 78 mm or less in total gate width of unit cell s formed on an Si substrate.

The manufacturing process can be simplified by forming the gate extraction electrode connection wiring line from the same multilayered interconnection made of tungsten silicide (WSi) and polysilicon as the gate finger electrode.

Since slits are formed in the gate and drain pads for connecting bonding wires, even if these pads are connected to adjacent pads, a bonding wire connection error can be detected by DC screening.

Since a fuse is formed on the drain extraction electrode connection wiring line, disconnection of the bonding wire for connecting the drain pad and lead frame can be detected by DC screening.

Accordingly, a defective can be screened without any time-consuming RF screening to achieve efficient inspection process and cost reduction.

What is claimed is:

1. A semiconductor device having a plurality of transistor units each of which is constituted by a unit prepared by arranging a plurality of unit cells each made up of a drain, gate, and source adjacent to each other on a major surface of a semiconductor substrate, a gate extraction electrode which extends in a direction perpendicular to a longitudinal direction of the gate and is commonly connected to the gates of the unit cells, a drain extraction electrode which is positioned at a side where said drain extraction electrode faces said gate extraction electrode via said unit, extends in a direction perpendicular to a longitudinal direction of the drain, and is commonly connected to the drains of the unit cells, a gate pad connected to said gate extraction electrode, and a drain pad connected to said drain extraction electrodes, wherein said gate pads of adjacent transistor units are connected to each other by a gate extraction electrode connection wiring line having a resistor of 0.6 to 10 $\Omega$, and said drain pads are connected to each other by a drain extraction electrode connection wiring line.

2. A device according to claim 1, wherein two units are respectively arranged on two sides of one gate extraction electrode, and the gates of the unit cells of said units are commonly connected to said gate extraction electrode, one end of said gate extraction electrode is connected to said gate pad, two drain extraction electrodes each of which extends in the direction perpendicular to the longitudinal direction of the drain and is commonly connected to the drains of the unit cells of a corresponding unit are arranged at sides where said drain extraction electrodes face said gate extraction electrode via corresponding units, and said two drain extraction electrodes are commonly connected to said drain pad arranged at an end opposite to said gate pad.

3. A device according to claim 1, wherein two units are respectively arranged on two sides of one drain extraction electrode, and the drains of the unit cells of said units are commonly connected to said drain extraction electrode, one end of said drain extraction electrode is connected to said drain pad, two gate extraction electrodes each of which extends in the direction perpendicular to the longitudinal direction of the gate and is commonly connected to the gates of the unit cells of a corresponding unit are arranged at sides where said gate extraction electrodes face said drain extraction electrode via corresponding units, and said two gate extraction electrodes are commonly connected to said gate pad arranged at an end opposite to said drain pad.

4. A device according to claim 1, wherein the semiconductor substrate is made of silicon, a total gate width of the unit cells is set not more than 40 mm, and said resistor of said gate extraction electrode connection wiring line has a resistance of 0.6 to 8 $\Omega$.

5. A device according to claim 1, wherein the semiconductor substrate is made of silicon, a total gate width of the unit cells is set not more than 78 mm, and said resistors of said gate and drain extraction electrode connection wiring lines have a resistance of 0.6 to 2.0 $\Omega$.

6. A device according to claim 1, wherein said gate extraction electrode connection wiring line is formed from a multilayered interconnection made of tungsten silicide (WSi) and polysilicon.

7. A device according to claim 1, wherein said gate pad is formed from a first region connected to said gate extraction electrode, a second region connected to said gate extraction electrode connection wiring line, and a slit for insulating the first and second regions, the first and second regions are connected to each other by a bonding wire, said drain pad is formed from a first region connected to said drain extraction electrode, a second region connected to said drain extraction electrode connection wiring line, and a slit for insulating the first and second regions, and the first and second regions are connected to each other by a bonding wire.

8. A device according to claim 7, wherein the first region and the second region of said gate pad or said drain pad are formed into a comb tooth shape via the slit.

9. A device according to claim 1, wherein said drain extraction electrode connection wiring line comprises a fuse.

10. A device according to claim 1, wherein at least either one or both of said drain and gate pads are connected to diodes.

11. A device according to claim 1, wherein two or one end of said gate extraction electrode is connected to a resistor of 1 to 16 $\Omega$.

* * * * *